US011899211B2

(12) United States Patent
Price et al.

(10) Patent No.: US 11,899,211 B2
(45) Date of Patent: Feb. 13, 2024

(54) PULSE-MODULATED LASER-BASED NEAR-EYE DISPLAY

(71) Applicant: Microsoft Technology Licensing, LLC, Redmond, WA (US)

(72) Inventors: Raymond Kirk Price, Redmond, WA (US); Michael Bleyer, Seattle, WA (US); Christopher Douglas Edmonds, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 14 days.

(21) Appl. No.: 17/357,855

(22) Filed: Jun. 24, 2021

(65) Prior Publication Data

US 2022/0413291 A1    Dec. 29, 2022

(51) Int. Cl.
*G02B 27/01* (2006.01)
*F21V 8/00* (2006.01)
(Continued)

(52) U.S. Cl.
CPC ......... *G02B 27/0172* (2013.01); *G02B 6/005* (2013.01); *G02B 6/0023* (2013.01);
(Continued)

(58) Field of Classification Search
CPC .. G02B 27/0172; G02B 6/0023; G02B 6/005; G02B 2027/0118; G02B 2027/0123;
(Continued)

(56) References Cited

U.S. PATENT DOCUMENTS 10,958,038 B2    3/2021  Shahin et al.
11,256,155 B2    2/2022  Popovich et al.
(Continued)

FOREIGN PATENT DOCUMENTS

WO    2018001318 A1    1/2018

OTHER PUBLICATIONS

"Non Final Office Action Issued in U.S. Appl. No. 17/357,804", dated Mar. 24, 2022, 17 Pages.
(Continued)

*Primary Examiner* — Jason M Mandeville
(74) *Attorney, Agent, or Firm* — Alleman Hall Creasman & Tuttle LLP

(57) ABSTRACT

A near-eye display device comprises a pupil-expansion optic, a laser, a drive circuit coupled operatively to the first and second lasers, a spatial light modulator (SLM), and a computer. The SLM has a matrix of electronically controllable pixel elements and is configured to receive emission from the laser and to direct the emission in spatially modulated form to the pupil-expansion optic. Coupled operatively to the drive circuit and to the SLM, the computer is configured to parse a digital image, trigger the emission from the laser by causing the drive circuit to drive a periodic current through a gain structure of the laser, and control the matrix of pixel elements such that the spatially modulated form of the emission projects an optical image corresponding to the digital image, wherein the periodic current includes plural cycles of modulation driven through the gain structure while the optical image is projected.

21 Claims, 16 Drawing Sheets

(51) Int. Cl.
  *G09G 3/02* (2006.01)
  *G09G 3/34* (2006.01)
  *H01S 5/042* (2006.01)
  *G09G 3/20* (2006.01)

(52) U.S. Cl.
  CPC ............ *G09G 3/02* (2013.01); *G09G 3/2081* (2013.01); *G09G 3/3413* (2013.01); *H01S 5/0425* (2013.01); *H01S 5/0428* (2013.01); *G02B 2027/014* (2013.01); *G02B 2027/0118* (2013.01); *G02B 2027/0123* (2013.01); *G02B 2027/0178* (2013.01)

(58) Field of Classification Search
  CPC ...... G02B 2027/0125; G02B 2027/014; G02B 2027/0178; H01S 5/0425; H01S 5/0428; G09G 3/002; G09G 3/02; G09G 3/2081; G09G 3/3413; G09G 3/3433
  USPC ......................................................... 345/691
  See application file for complete search history.

(56) References Cited

U.S. PATENT DOCUMENTS

| | | | |
|---|---|---|---|
| 2009/0097507 A1* | 4/2009 | Zhu .................. | H01S 3/1312 372/6 |
| 2010/0060551 A1 | 3/2010 | Sugiyama et al. | |
| 2010/0110368 A1 | 5/2010 | Chaum | |
| 2013/0021586 A1* | 1/2013 | Lippey .................. | G02B 27/48 353/69 |
| 2013/0222384 A1 | 8/2013 | Futterer et al. | |
| 2015/0229108 A1 | 8/2015 | Steigerwald et al. | |
| 2017/0160548 A1 | 6/2017 | Woltman et al. | |
| 2017/0329140 A1 | 11/2017 | Yeoh et al. | |
| 2018/0329224 A1 | 11/2018 | Asakawa et al. | |
| 2019/0129184 A1 | 5/2019 | Hu et al. | |
| 2019/0171026 A1 | 6/2019 | Parsons | |
| 2019/0372306 A1 | 12/2019 | Reidy et al. | |
| 2020/0081176 A1 | 3/2020 | Bartlett et al. | |
| 2020/0099194 A1 | 3/2020 | Price et al. | |
| 2020/0192025 A1 | 6/2020 | Tervo et al. | |
| 2020/0310111 A1 | 10/2020 | Mcnally et al. | |
| 2020/0366065 A1 | 11/2020 | Shahin et al. | |
| 2020/0373734 A1 | 11/2020 | Shahin et al. | |
| 2021/0072553 A1 | 3/2021 | Danziger et al. | |
| 2021/0109351 A1 | 4/2021 | Danziger et al. | |
| 2021/0194206 A1* | 6/2021 | Raring ................ | H01S 5/02326 |
| 2021/0218224 A1* | 7/2021 | Dyer .................... | H01S 5/0428 |
| 2021/0278669 A1 | 9/2021 | Fabien et al. | |
| 2021/0281047 A1 | 9/2021 | Shahin et al. | |
| 2021/0336421 A1 | 10/2021 | Kawashima | |
| 2022/0066213 A1* | 3/2022 | Zhao .................. | H04N 9/3111 |
| 2022/0413290 A1* | 12/2022 | Price ................. | G02B 27/0922 |

OTHER PUBLICATIONS

"Non Final Office Action Issued in U.S. Appl. No. 17/357,834", dated Sep. 12, 2022, 29 Pages.

"International Search Report and Written Opinion Issued in PCT Application No. PCT/US22/029515", dated Jul. 26, 2022, 16 Pages.

"International Search Report and Written Opinion Issued in PCT Application No. PCT/US22/029518", dated Sep. 19, 2022, 13 Pages.

"International Search Report and Written Opinion Issued in PCT Application No. PCT/US22/029519", dated Aug. 19, 2022, 13 Pages.

"Notice of Allowance Issued in U.S. Appl. No. 17/357,834", dated Jan. 24, 2023, 8 Pages.

* cited by examiner

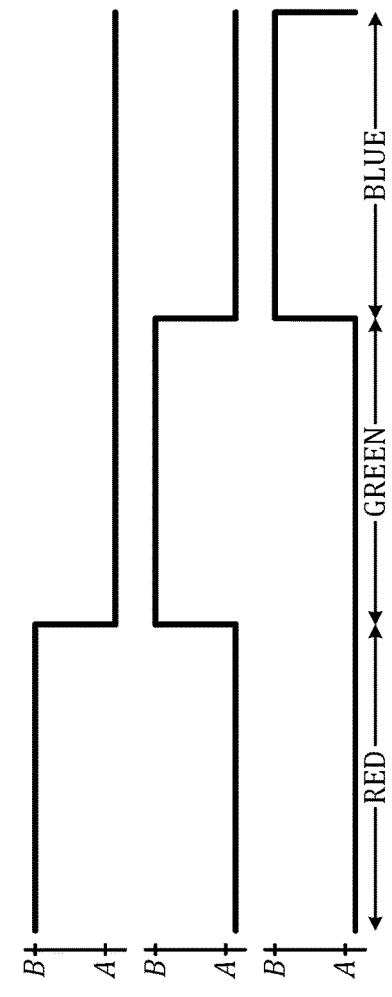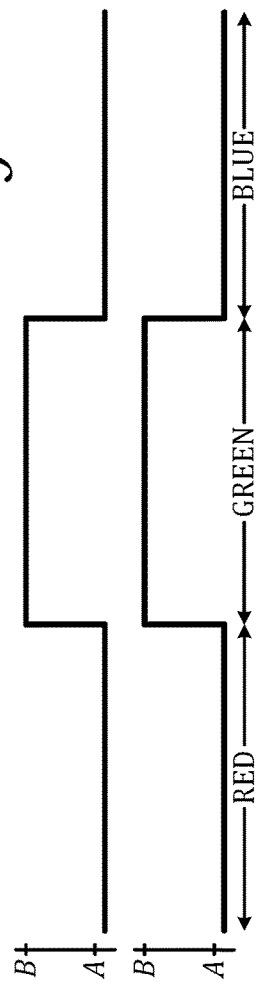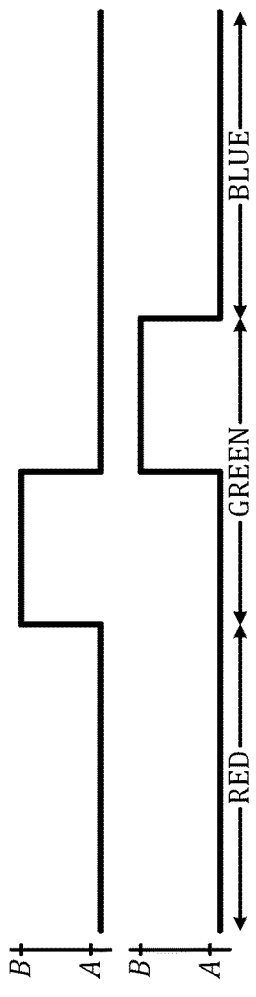

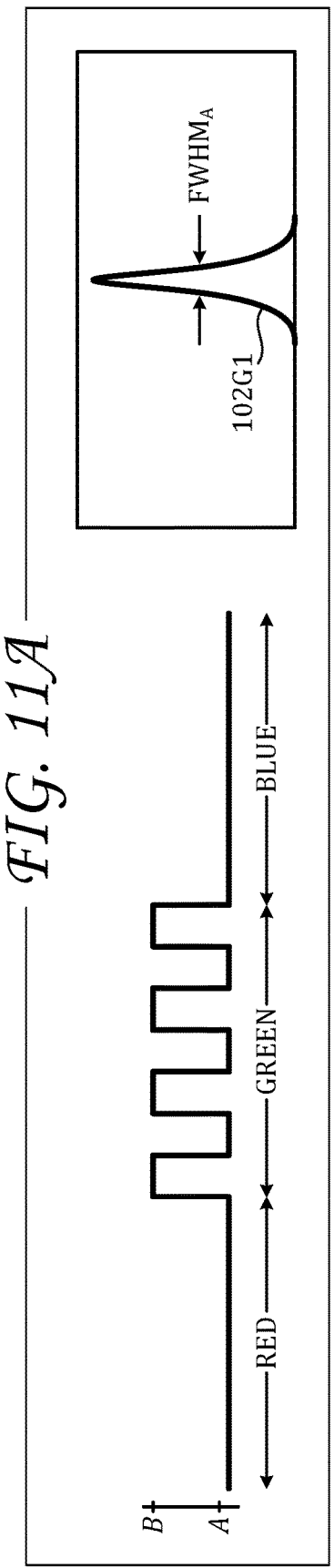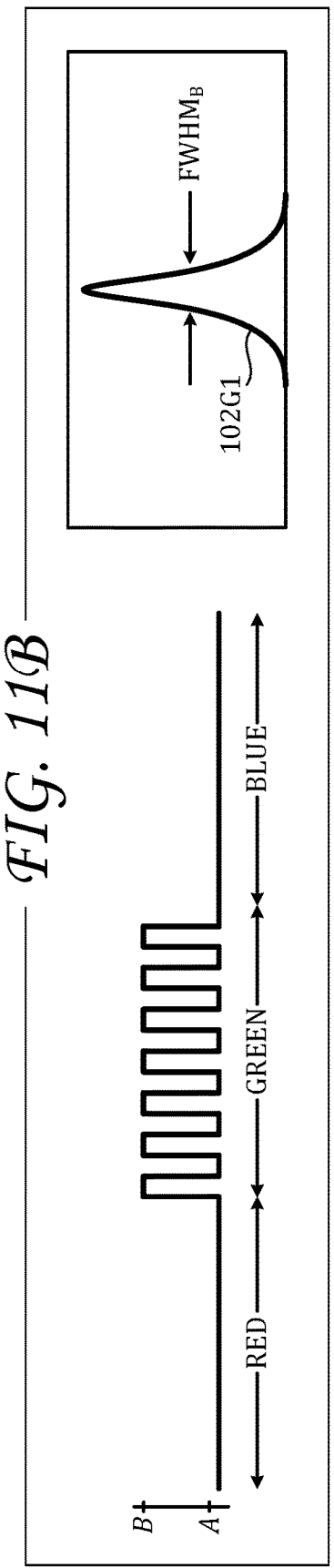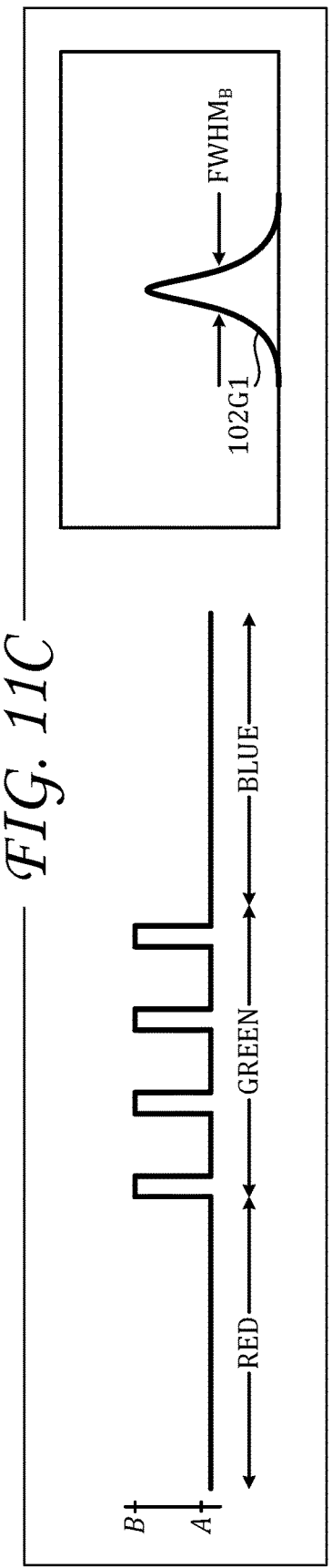

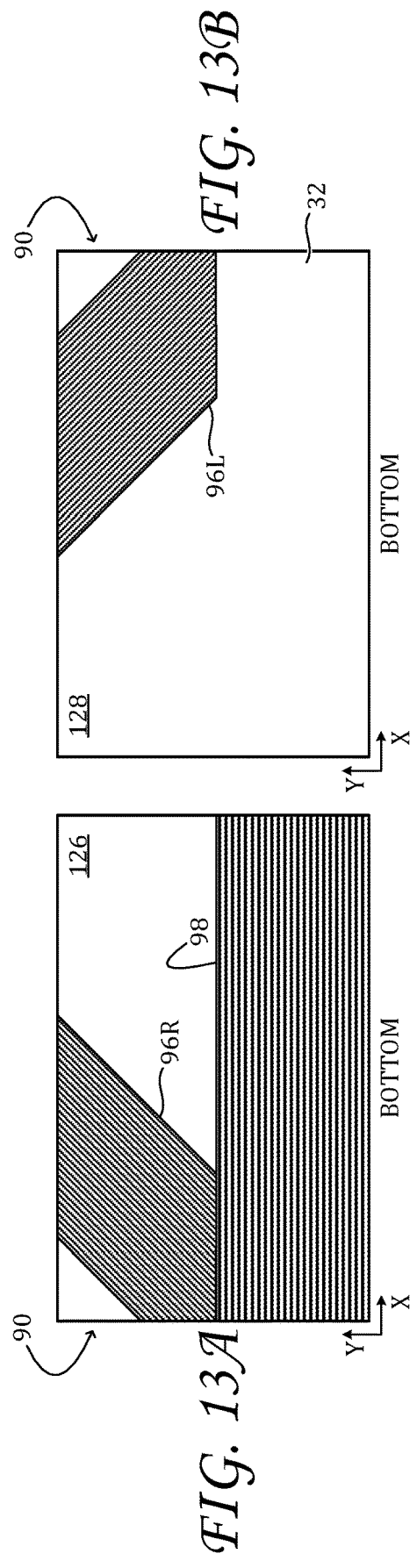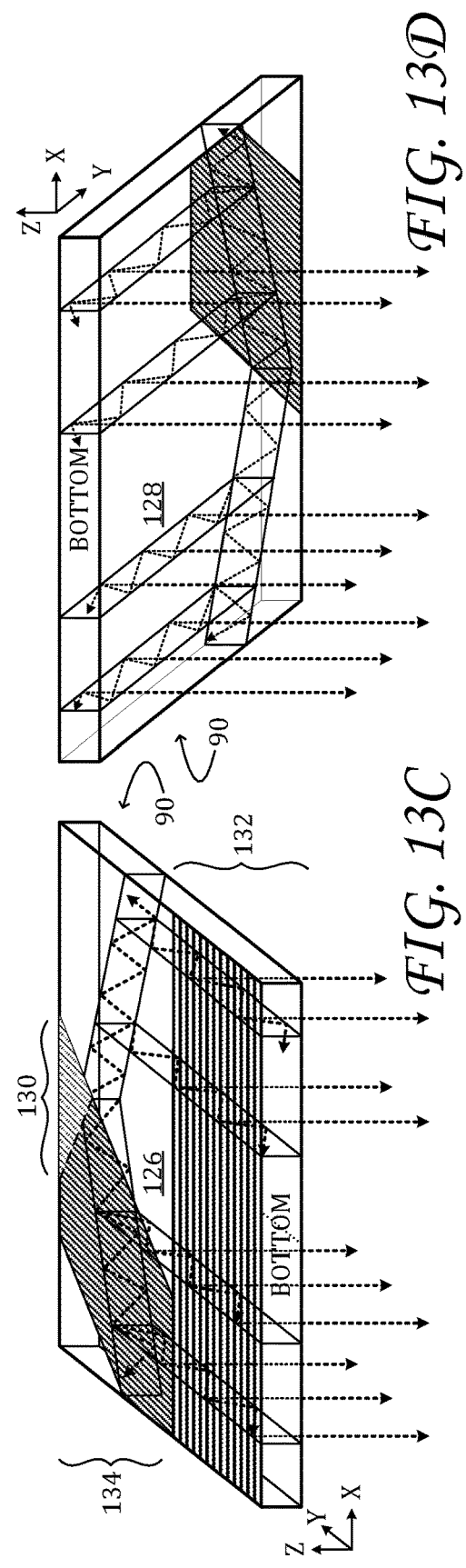

PULSE-MODULATED LASER-BASED NEAR-EYE DISPLAY

BACKGROUND

Near-eye display technology has evolved in recent years into an emerging consumer technology. In head-worn display devices, for example, binocular near-eye display provides 3D stereo vision for virtual-reality (VR) presentation. When implemented with see-through optics, near-eye display provides mixed- or augmented-reality (AR) presentation, where VR elements are admixed into a user's natural field of view. Despite such benefits, near-eye display technology still faces various technical challenges, including the challenge of providing desired display luminance using compact, light-weight, low-power components.

SUMMARY

One aspect of this disclosure relates to a near-eye display device comprising a pupil-expansion optic, a laser, a drive circuit coupled operatively to the laser, a spatial light modulator (SLM), and a computer. The SLM has a matrix of electronically controllable pixel elements and is configured to receive emission from the laser and to direct the emission in spatially modulated form to the pupil-expansion optic. Coupled operatively to the drive circuit and to the SLM, the computer is configured to parse a digital image, trigger the emission from the laser by causing the drive circuit to drive a periodic current through a gain structure of the laser, and control the matrix of pixel elements such that the spatially modulated form of the emission projects an optical image corresponding to the digital image, wherein the periodic current includes plural cycles of modulation driven through the gain structure while the optical image is projected.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

FIGS. 7A, 7B, and 7C show aspects of example timing diagrams for illuminator modulation in a display projector of a near-eye display device.

FIGS. 11A, 11B, and 11C show aspects of additional example timing diagrams for laser modulation in a near-eye display device.

FIGS. 13A, 13B, 13C, and 13D show aspects of an example pupil-expansion optic of a near-eye display device.

DETAILED DESCRIPTION

Figure 1:
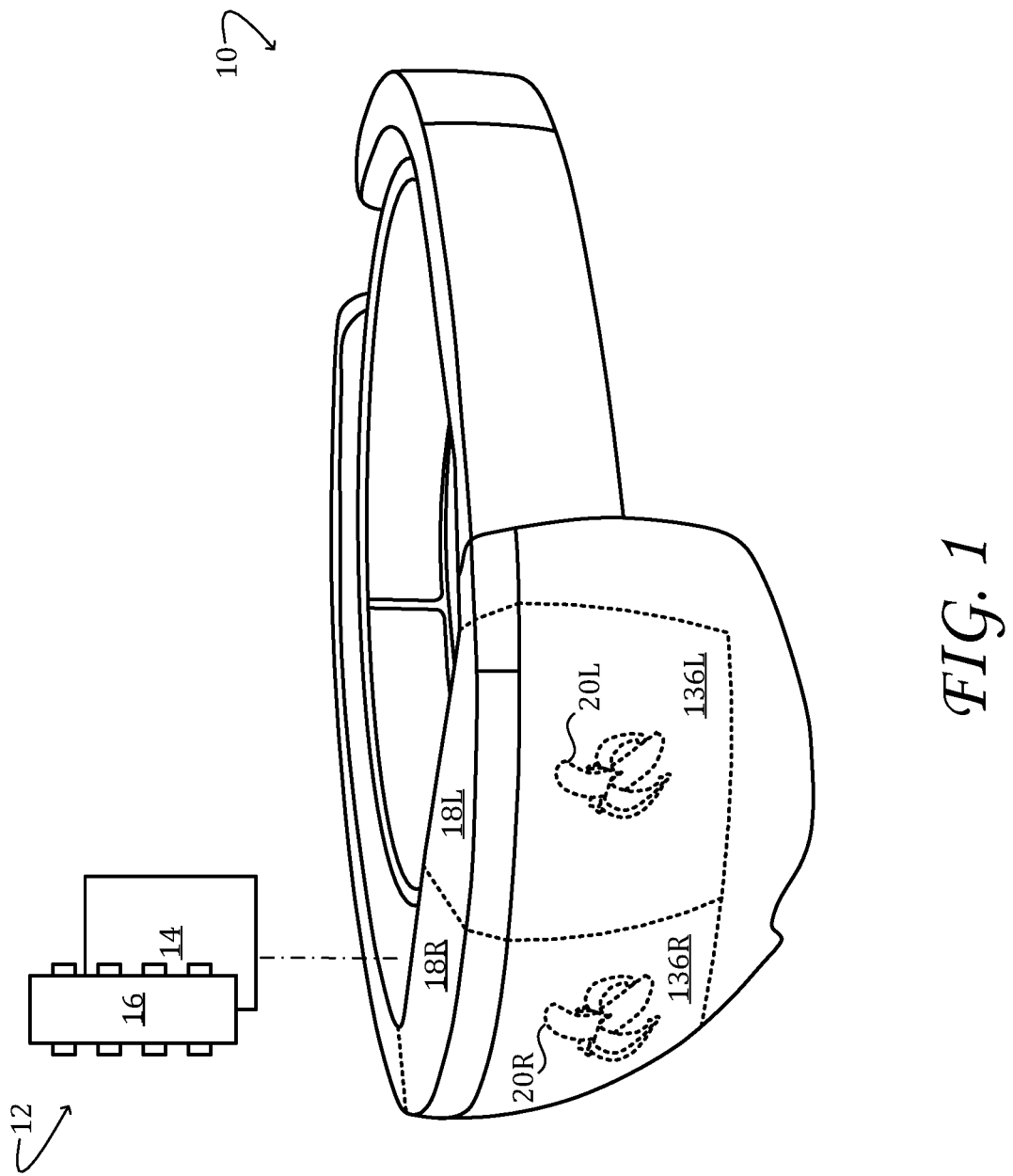
FIG. 1 shows aspects of an example near-eye display device.

This disclosure is presented by way of example and with reference to the drawing figures listed above. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

As noted above, one challenge facing near-eye display technology is the ability to project high-luminance display imagery using compact, light-weight, low-power components. This is especially true for near-eye display devices in which a spatial-light modulator (SLM) is used to form the display imagery. SLM variants such as liquid-crystal-on-silicon (LCOS) and digital micromirror device (DMD) matrices are capable of high-brightness operation with good spatial and color fidelity. The overall power efficiency of an SLM-based display is limited, however, by the efficiency of illumination of the SLM. Light-emitting diode (LED) emitters, while sufficiently compact for near-eye display, exhibit significant etendue loss and require downstream polarization filtering for SLM illumination. Etendue and polarization losses for LED illumination of an SLM may be about 30% and 50%, respectively.

In contrast, the output of a semiconductor laser is intrinsically polarized and etendue-conserving, and some semiconductor lasers provide high brightness and high efficiency. Nevertheless, the spatial and temporal coherence of laser emission may be problematic for near-eye display. At any angle in the user's field of view, a near-eye display device admits of plural optical paths from the emission source to the user's anatomical pupil. When coherent light arriving along any two of the optical paths converges at the pupil, such light will interfere constructively or destructively. Accordingly, at angles in the field-of-view where the difference in the optical path lengths matches a longitudinal mode of the coherent emission, the user may see a distracting display artifact in the form of an interference fringe.

The solutions herein provide practical ways of using laser emission to illuminate an SLM in a near-eye display device. Among other advantages, they provide high brightness with fewer artifacts of illumination coherence. In this manner, the disclosed solutions, enacted separately or in any combination, enable compact, light-weight, energy-efficient near-eye display.

One solution is to illuminate the SLM using plural lasers in one to all of the primary-color channels. The plural lasers of each primary-color channel may differ in cavity length, thereby providing broader (i.e., less monochromatic) emission, with additional longitudinal modes. Thus, for any mode matched to an optical path-length difference and causing an interference fringe, there will be one or more additional modes unmatched to the optical path-length difference. As a result, interference fringes due to any one mode are effectively 'washed out'—i.e., reduced to a chromatic variation that the user cannot perceive, thus mitigating potentially distracting visual artifacts.

Another solution achieves a similar effect but with fewer lasers for each primary-color channel. It leverages the broadened gain spectrum of a semiconductor laser driven by modulated current of sufficient high-frequency content. By modulating the drive current above and below the lasing threshold over predetermined intervals, stimulated emission is achieved over a range of wavelengths (and longitudinal modes) broad enough to wash out the interference fringes as noted above. In some examples, a single drive-modulated laser can simulate the emission spectrum of plural lasers having different cavity lengths.

Related to the strategies above is an additional solution of combining, efficiently and compactly, the output of plural semiconductor lasers. State-of-the-art birefringence- or diffraction-based beam combiners may not be scalable to larger numbers of combined beams without exceeding the tight dimensional constraints of a practical near-eye display device. By contrast, the geometric beam combiner disclosed herein is linearly scalable to larger numbers of combined beams. Furthermore, the arrangement of the geometric beam combiner relative to the individual lasers allows the same set of collimation optics to be used to collimate the emission from every beam en route to the SLM.

Turning now to the drawings, FIG. 1 shows aspects of an example near-eye display device 10. The near-eye display device is configured to be worn and operated by a user and to display still or moving images in the user's field-of-view. In some examples, the near-eye display device may include or be part of an AR or VR system that presents computer-generated, holographic imagery in the user's field-of-view. In some examples, user-input componentry of the AR or VR system may enable the user to interact with (e.g., manipulate) such imagery. To support any, some, or all of these functions, inter alia, near-eye display device 10 includes an onboard computer 12 having a processor 14 and associated computer memory 16. In the illustrated example, near-eye display device 10 takes the form of a head-mounted visor. In other examples, a near-eye display device may take the form of goggles, a helmet, or eyeglasses. In still other examples, a near-eye display device may be a component of a non-wearable display system, such as a display system installed in a vehicle.

Near-eye display device 10 is configured for binocular image display. To that end, the near-eye display device includes a right monocular system 18R that presents a right optical image 20R in front of the user's right eye, and a left monocular system 18L that presents a left optical image 20L in front the user's left eye. For stereoscopic display the right and left optical images may be configured with stereo disparity appropriate to display a three-dimensional subject or scene (as described with reference to FIGS. 14A and 14B). In other examples, binocular display may be provided via a single display projected system akin monocular system 18, but configured to project the right and left optical images into the right and left eyes, respectively.

Figure 2:
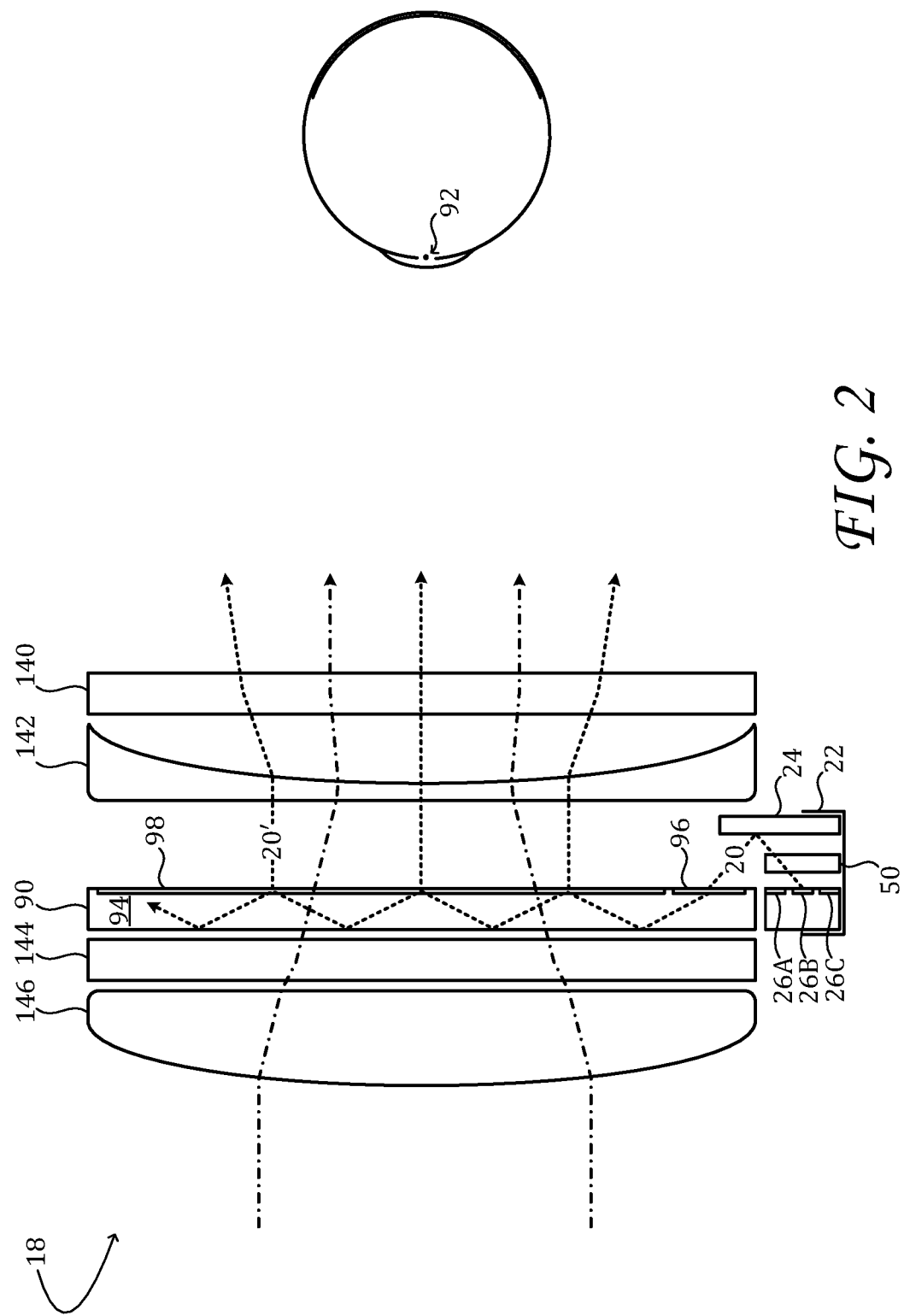
FIG. 2 shows aspects of an example monocular system of a near-eye display device.

FIG. 2 shows aspects of an example monocular system 18 of near-eye display device 10. The monocular system includes a display projector 22 configured to form an optical image 20. The display projector includes a high-resolution SLM 24 illuminated by a plurality of lasers 26. Each laser is configured to emit (i.e., lase) in a particular wavelength band—e.g., first laser 26A is configured to emit in a first wavelength band, second laser 26B is configured to emit in a second wavelength band, and third laser 26C is configured to emit in a third wavelength band. In some examples, the plurality of lasers may include at least one laser of each primary color—e.g., red, green, and blue.

The primary color red refers herein to light of one or more bands, however narrow, that fall within a range of 625 to 700 nanometers (nm). The primary color green refers to light of one or more bands, however narrow, that fall within a range of 500 to 565 nm. The primary color blue refers to light of one or more bands, however narrow, that fall within a range of 440 to 485 nm. In some examples, the wavelength ranges of the primary colors here noted may be broadened by as much as 10%. In some examples, the ranges of the primary colors here noted may be narrowed by as much as 10%.

Any, some, or all of the lasers may take the form of a semiconductor laser, such as a diode laser. In more particular examples, any, some, or all of the lasers may take the form of an edge-emitting diode laser, a double-heterostructure laser, a quantum-well laser, a distributed Bragg-reflector laser, a vertical-cavity surface-emitting laser, and/or an external-cavity laser, as examples. Efficient, compact lasers of virtually any architecture may be used.

Figure 3:
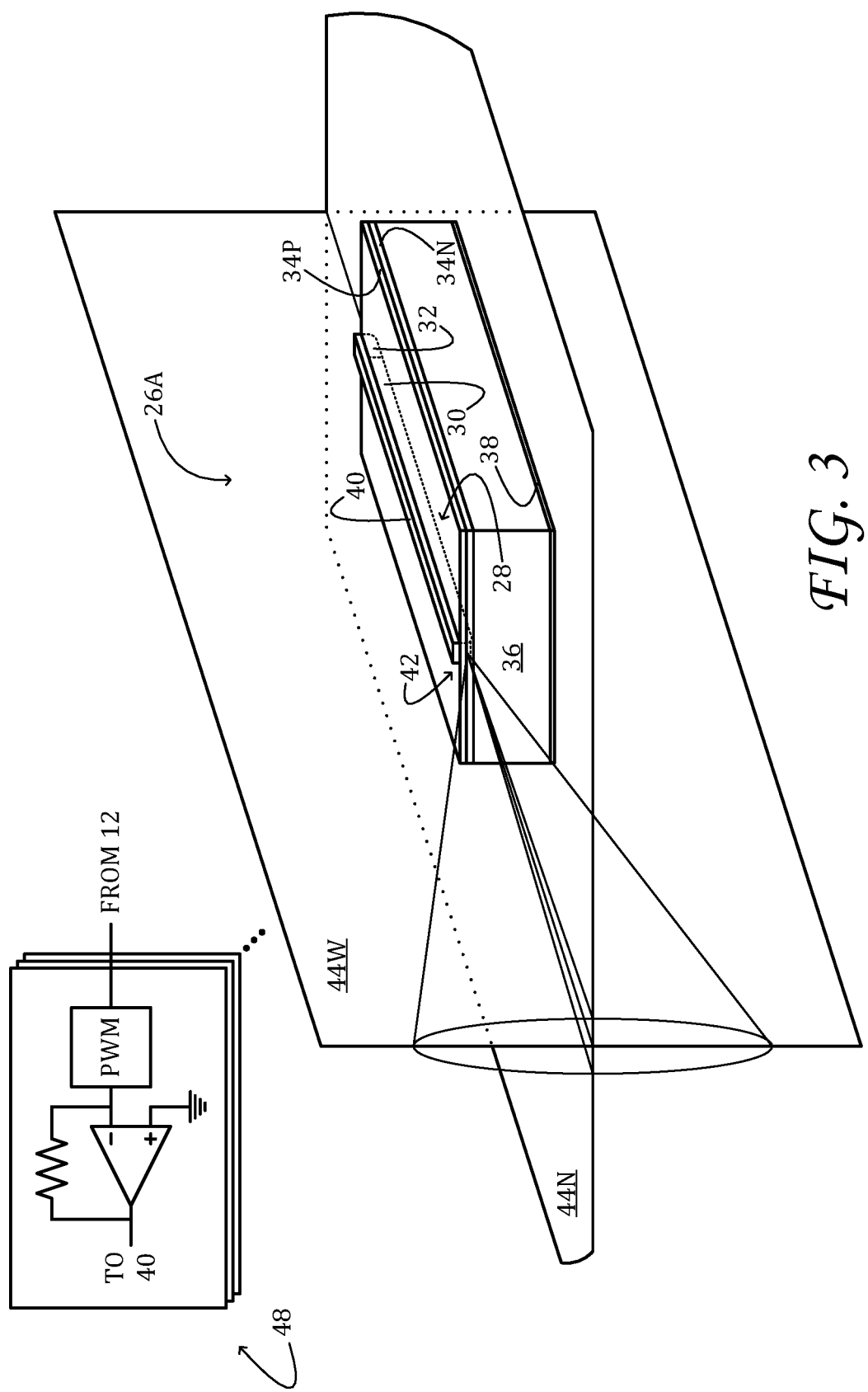
FIG. 3 shows aspects of an example edge-emitting diode laser of a near-eye display device.

FIG. 3 shows aspects of an example edge-emitting diode laser 26A. Laser 26A includes an elongate optical cavity 28 spanning a gain structure 30 and a reflector structure 32. The gain structure includes epitaxial layers 34P and 34N, which bracket the optical cavity in the epitaxial direction. Epitaxial layer 34N is an n-doped layer grown on n-type substrate 36 and coupled to electrically conductive (e.g., metal) cathode 38. Epitaxial layer 34P is a p-doped layer grown on epitaxial layer 34N and coupled to electrically conductive anode 40. Partially reflective aperture 42 is arranged at one end of the optical cavity; reflector structure 32 is arranged at the opposite end. Pumped by electric current flowing from anode 40 to cathode 38, gain structure 30 amplifies the light reflecting back and forth within the optical cavity via stimulated radiative emission. Reflector structure 32 may comprise a diffractive reflector providing high reflectance and wavelength selectivity. In one example, the reflector structure includes a coated facet of the diode laser with parallel layers of alternating refractive index aligned perpendicular to the optical cavity. Reflections from the interfaces between layers combine constructively to achieve a partially or highly reflective facet in a selected wavelength band.

Continuing in FIG. 3, the emission from an edge-emitting diode laser diverges maximally in a wide-divergence plane 44W and diverges minimally in a narrow-divergence plane 44N, orthogonal to the wide-divergence plane. In some examples, the 'angle' of divergence in the wide-divergence plane may be diffraction-limited and Gaussian, at 20 to 40 degrees FWHM; the angle of divergence in the narrow-divergence plane may be about 5 to 10 degrees.

Each laser 26 of display projector 22 is coupled operatively to drive circuit 48. The drive circuit is configured to drive a controlled current through each of the lasers—a first current through first laser 26A, a second current through second laser 26B, etc. More particularly, the controlled current is driven through gain structure 30, from anode 40 to cathode 38. In some examples, drive circuit 48 is configured to drive a periodic current through the gain structure. This feature supports field-sequential color display, pulse-width modulation for color balance, and spectral broadening as described hereinafter. The drive circuit may include, inter alia, a pulse-width modulator and a transconductance amplifier for each driven laser.

Figure 4:
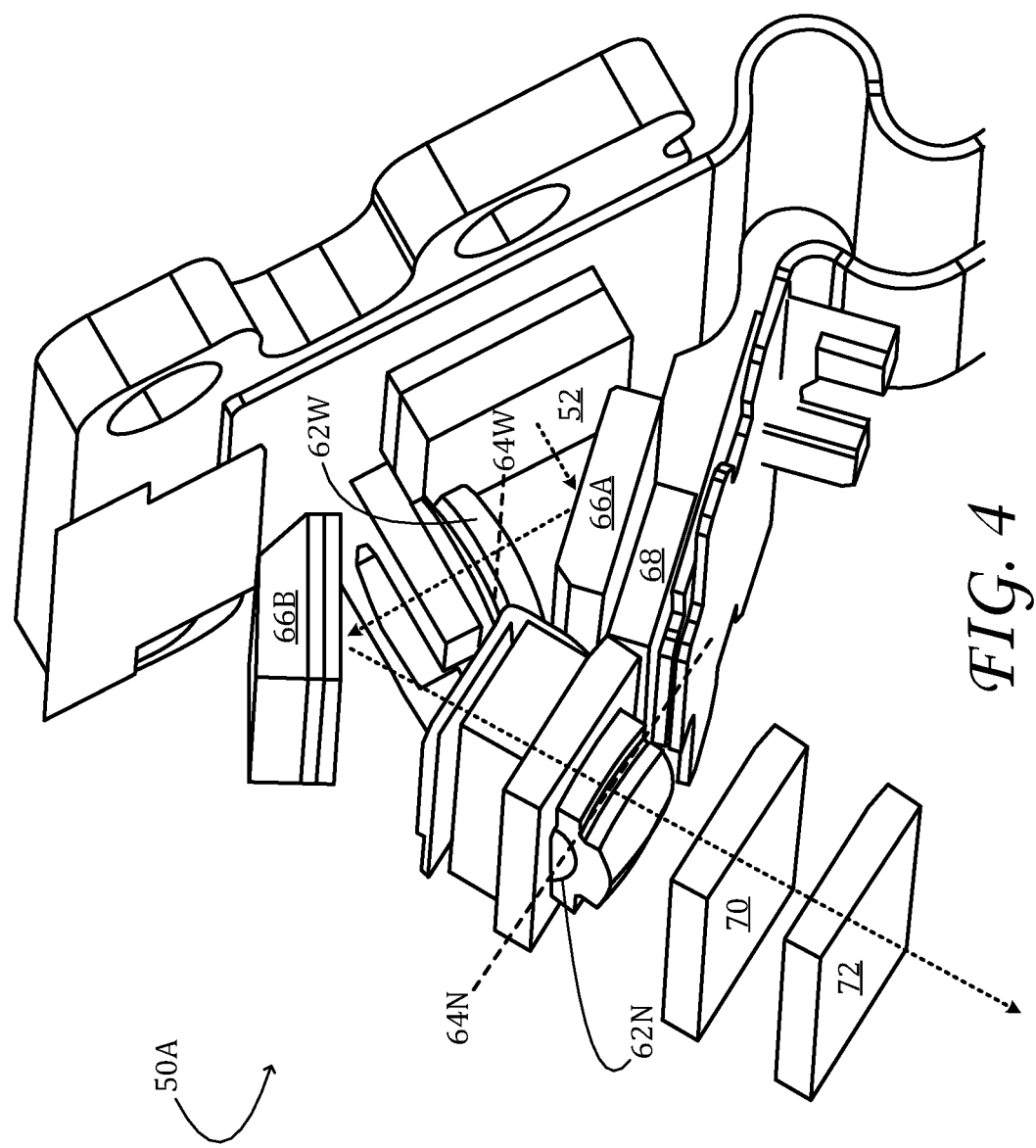
FIG. 4 shows aspects of an example beam combiner of a near-eye display device.
Figure 5:
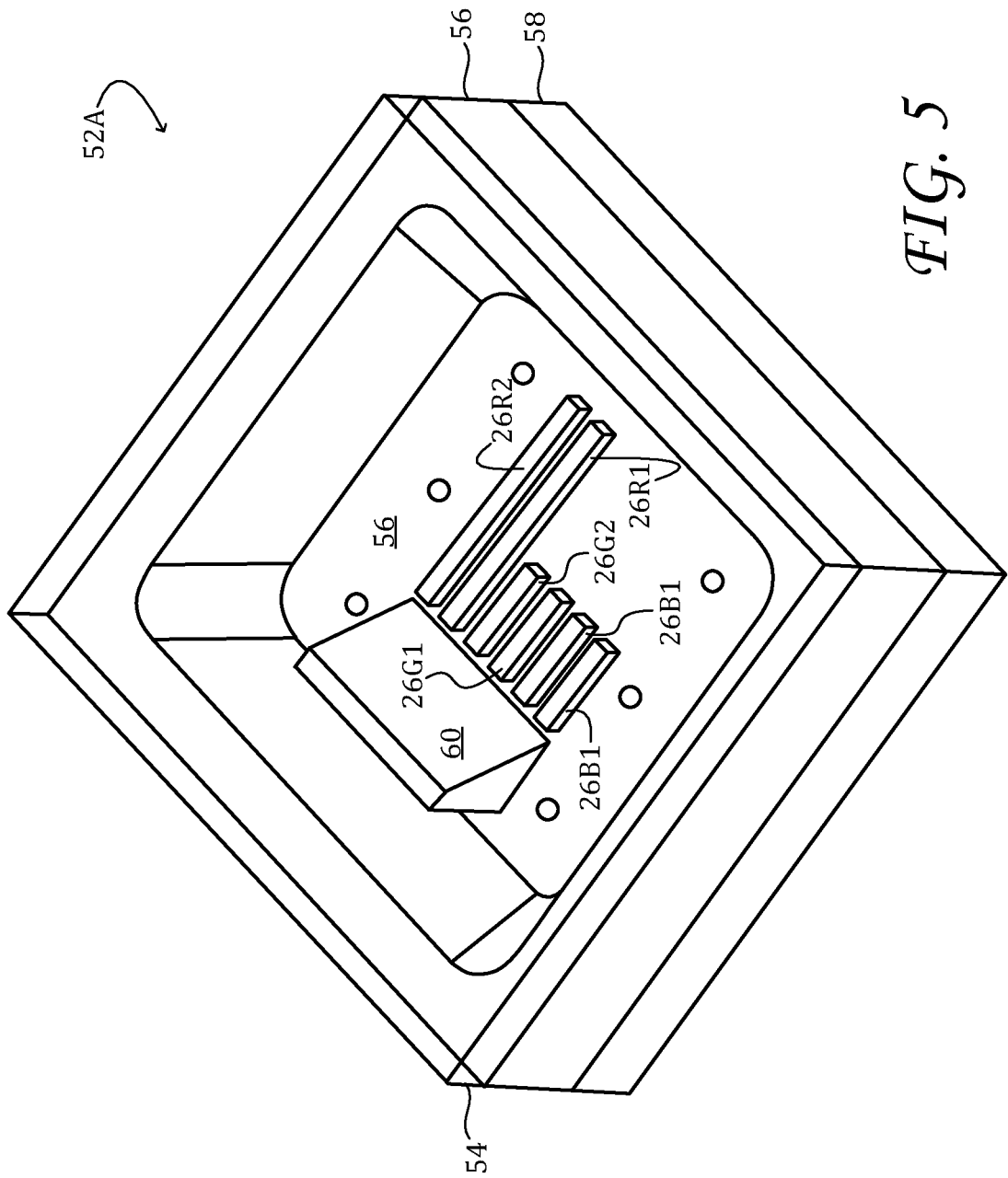
FIG. 5 shows aspects of an example laser enclosure of a near-eye display device.

In some examples, the plurality of lasers 26 may illuminate SLM 24 via a beam combiner arranged in display projector 22. The beam combiner may be configured to geometrically combine concurrent and/or sequential emission from each of the lasers into a collimated beam. FIG. 4 shows aspects of an example beam combiner 50A. Beam combiner 50A includes a laser enclosure 52 in which lasers 26 are arranged. FIG. 5 shows aspects of an example laser enclosure 52A.

Laser enclosure 52A includes a window 54 configured to transmit the emission from the lasers. In some examples, the atmosphere within the laser enclosure may be substantially depleted of oxygen. Each of the lasers 26 may be oriented in laser enclosure 54A such that the wide-divergence planes 44W of the lasers are parallel to each other and orthogonal to base 56 of the laser enclosure. To that end, the lasers may be oriented with mutually parallel optical cavities 28. In some examples, some or all of the lasers may share an electrode, such as cathode 38, which is arranged in contact with base 56. In the illustrated example, the base delimits a flat mount 58 configured to carry heat away from the lasers. While not strictly necessary, any, some, or all of the lasers 26 may be arranged such that narrow-divergence plane 44N is common to all of the lasers. To that end, the lasers may be arranged such that every optical cavity 28 lies within the same narrow-divergence plane.

Generally speaking, the laser enclosure may be configured to redirect (viz., to reflect or refract) the emission from any, some, or all of the lasers out of the narrow-divergence plane. This beam-turning effect contributes to an overall compact configuration of the beam combiner. In the illustrated example, laser enclosure 52A includes a mirror 60 configured to receive and reflect emission from lasers 26 and thereby achieve this effect. In the illustrated example, mirror 60 is arranged within the laser enclosure, behind window 54. In some examples the mirror may support one or more high-reflectance coatings—e.g., a different diffractive coating for each primary color, configured to reflect wavelengths corresponding to that primary color. In some examples, the mirror 60 may be a glass mirror. In other examples, the mirror may comprise highly polished and passivated metal, such as aluminum.

As shown in FIG. 4, the beam combiner may include one or more collimation optics configured to collimate the combined emission from the lasers. In the illustrated example, beam combiner 50A includes a wide-diameter cylindrical collimation optic 62W and a narrow-diameter cylindrical collimation optic 62N. The wide-diameter cylindrical collimation optic has a cylindrical axis 64W aligned normal to the wide-divergence planes of the lasers. The narrow-diameter cylindrical collimation optic has a cylindrical axis 64N aligned normal to any plane orthogonal to the wide-divergence planes of the lasers. Accordingly, the wide-diameter cylindrical collimation optic reverses the divergence occurring in wide-divergence planes 44W, and the narrow-diameter cylindrical collimation optic reverses the divergence occurring in narrow-divergence planes 44N.

In other examples, an engineered aspherical Fresnel optic may be used to collimate the combined emission from lasers 26. Turning optics 66A and 66B of beam combiner 50A fold the optical axis of laser enclosure 52, contributing to an overall compact configuration. Beam combiner 50A includes one or more sensors 68 (e.g., photodiodes) having an output responsive to the concurrent emission of lasers 26. Output of the sensor can be used to maintain color balance in monocular system 18, as described further below.

Beam combiner 50A includes a diffuser 70 arranged in series with the one or more collimation optics and configured to diffuse the emission from lasers 26. The diffuser is configured to homogenize the collimated beam so that the emission from each laser homogeneously illuminates the matrix of pixel elements of SLM 24. Beam combiner 50 includes a laser despeckler 72 arranged in series with the collimation optics and configured to despeckle the emission from lasers 26. 'Speckle' is observed when a spatially coherent, monochromatic wavefront interacts with a surface rough enough to scatter the light along optical paths that differ on the order of a wavelength and arrive at the same observation point. In the illustrated example, the diffuser is arranged optically downstream of the collimation optics, and the despeckler is arranged optically downstream of the diffuser.

A beam combiner may be configured to geometrically combine emission from plural lasers 26 irrespective of the wavelength or polarization state of the emission. For instance, a beam combiner may combine emission from first and second lasers having the same emission spectrum but differing substantially in output power. A first laser of higher output power may be turned when high brightness is required in a given color channel; a second laser of lower output power may be turned on when high-brightness is not required. A beam combiner may also combine emission from lasers having different emission spectra, as described hereinafter.

SLM 24 of FIG. 2 includes a matrix of electronically and independently controllable pixel elements. The particular SLM technology may vary from one implementation to the next. In FIG. 2, display projector 22 forms optical image 20 by reflection of laser emission from the SLM. In other examples, an optical image may be formed by transmission of the laser emission through a suitably configured, transmissive SLM. In some examples, the SLM may comprise a liquid-crystal-on-silicon (LCOS) matrix. In other examples, the SLM may comprise a digital light projector (DLP) such as a digital micromirror device (DMD).

Figure 6:
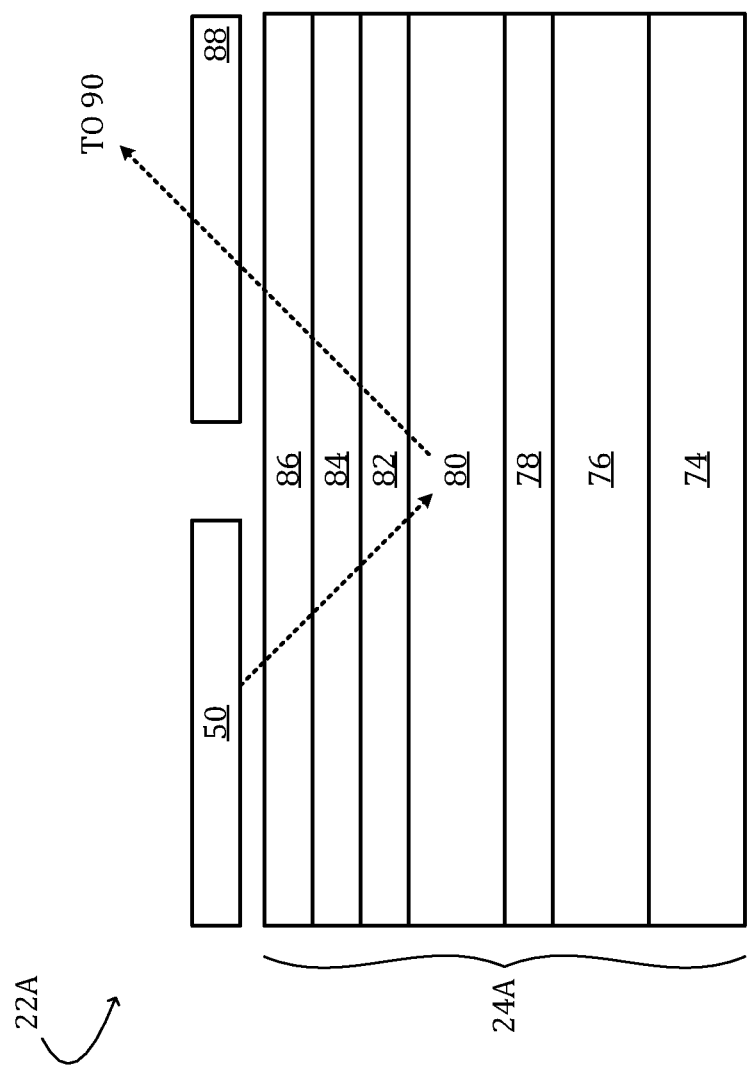
FIG. 6 shows aspects of an example display projector of a near-eye display device, based on a reflective LCOS-type SLM.

FIG. 6 shows aspects of an example display projector 22A of a near-eye display device. Display projector 22A is based on a reflective LCOS-type SLM 24A. The display projector includes a PCB mounting 74. Arranged over the PCB mounting, CMOS layer 76 defines the matrix of pixel elements of the SLM. A high-efficiency reflective coating 78 is arranged over the CMOS layer and configured to reflect the incident beam from beam combiner 50. The incident beam is spatially modulated via liquid-crystal (LC) layer 80. The LC layer includes a film of LC molecules (e.g., nematic LC molecules) maintained in quiescent alignment via alignment layer 82. One or more transparent electrodes 84 are arranged over the alignment layer. The one or more transparent electrodes may include a degenerately doped semiconductor (e.g., indium tin oxide) on a suitable substrate. In other examples, the one or more transparent electrodes may include a microwire mesh or an extremely thin metal film. Cover glass 86 is arranged over the one or more transparent electrodes. In this configuration, the spatially modulated light reflecting from reflective coating 78 is directed back through the stack to exit polarizer 88 and then on to the eyepiece (e.g., pupil-expansion optic) of monocular system 18.

Computer 12 is coupled operatively to drive circuit 48 and to SLM 24. The computer is configured to parse a digital image, which may comprise plural component images, each associated with a corresponding primary color (e.g., red, green, and blue). The computer is configured to trigger emission from any, some, or all of the lasers 26 by controlling the drive currents supplied to gain structures 30 of the lasers by drive circuit 48. The computer is also configured to control the matrix of pixel elements of SLM 24. Such control is enacted synchronously and coordinately, such that the spatially modulated form of the emission emerging from the SLM projects an optical image 20 corresponding to the parsed digital image. In some examples, the computer is configured to coordinately control the drive circuit and the matrix of pixel elements in a time-multiplexed manner to provide field-sequential color display. By repeating such control over a time-indexed sequence of digital images, the computer may cause display projector 22 to project video.

Returning again to FIG. 2, display projector 22 projects optical image 20 through a physical aperture of finite size. Optics downstream of the display projector focus the optical image onto the anatomical right or left pupil of the user. In doing so, the downstream optics direct the image through an entry pupil, defined as the image of the physical aperture at the anatomical-pupil position. Due to the small size of the physical aperture and other factors, the entry pupil may be too small to align reliably to the user's anatomical pupil. Accordingly, monocular system 18 includes a pupil-expansion optic 90. In the illustrated example, SLM 24 is configured to direct the combined emission from lasers 26, in spatially modulated form, to the pupil-expansion optic. The pupil-expansion optic releases the optical image over an expanded exit pupil, which may be large enough to cover the entire area over which the user's pupil is likely to be. Such an area is called an 'eyebox'.

Pupil-expansion optic 90 is configured to receive optical image 20 from display projector 22 and to release an expanded form 20' of the optical image toward the pupil position 92. In the illustrated example, the pupil-expansion optic includes an optical waveguide 94, an entry grating 96 and an exit grating 98. The pupil-expansion optic may also include other gratings not shown in FIG. 2. It will be understood that the term 'grating' is broadened herein to include any kind of diffractive optical element (DOE), irrespective of whether that element includes a pattern of elongate diffractive features. Non-limiting example gratings include a surface-relief type grating comprising a series of closely spaced channels formed on the optical waveguide, or a volume grating or index-modulated grating formed in the optical-waveguide material.

Entry grating 96 is a diffractive structure configured to receive optical image 20 and to couple the light of the optical image into optical waveguide 94. After coupling into the optical waveguide, the display light propagates through the optical waveguide by total internal reflection (TIR) from the front and back faces of the optical waveguide. Exit grating 98 is a diffractive structure configured to controllably release the propagating display light from the optical waveguide in the direction of pupil position 92. To that end, the exit grating includes a series of light-extraction features arranged from weak to strong in the direction of display-light propagation through the optical waveguide, so that the display light is released at uniform intensity over the length of the exit grating. In this manner, pupil-expansion optic 90 may be configured to expand the exit pupil of display projector 22 so as to fill or overfill the eyebox of the user. This condition provides desirable image quality and user comfort.

In some examples, pupil-expansion optic 90 may expand the exit pupil of display projector 22 in one direction only—e.g., the horizontal direction, in which the most significant eye movement occurs. Here, the display projector itself may offer a large enough exit pupil—natively, or by way of a vertical pre-expansion stage—so that vertical expansion within the optical waveguide is not necessary. In other examples, pupil-expansion optic 90 may be configured to expand the exit pupil in the horizontal and vertical directions. In such examples, display light propagating in a first direction within the optical waveguide may encounter a turning grating (not shown in FIG. 2) having a plurality of diffraction features arranged weak to strong in a first direction. The turning grating may be configured such that the light diffracted by the diffraction features is turned so as to propagate in a second direction, having now been expanded in the first direction. Parallel rays of the expanded light then encounter exit grating 98 and are out-coupled from the waveguide as described above. A more detailed example of a pupil-expansion optic employing a turning grating is described hereinafter, in connection to FIGS. 13A through 13D.

Despite the utility of diffractive optical elements for coupling light into and out of an optical waveguide, incoupling and out-coupling optical elements based on reflection, refraction, and/or scattering are envisaged as alternatives to DOEs. In still other examples, a pupil-expansion optic may include, in lieu of an optical waveguide, a series of reflective-refractive interfaces (so-called 'venetian blinds') oriented 45 degrees relative to the optical axis. Irrespective of the particular pupil-expansion technology employed, a pupil expansion optic necessarily increases the number of optical path lengths between the emission source and the user's pupil, thereby increasing the potential for overlap between the optical path lengths and the longitudinal mode spacings of coherent laser emission.

FIGS. 7A, 7B, and 7C show aspects of example timing diagrams for illuminator modulation in a display projector of a near-eye display device. The timing diagram of FIG. 7A illustrates the strategy known as 'field-sequential color display', where red, green, and blue illuminators are energized during successive intervals within each image frame. During the interval in which the red-emitting illuminator is energized, the pixel elements of the SLM are biased according to the component digital image corresponding to the red-color channel, and likewise for the green- and blue-emitting illuminators. The required modulation for field-sequential color display is slow on the timescale of illuminator and SLM response but fast on the timescale of the human ocular system. Accordingly, the component red, green, and blue images appear fused to the near-eye display user.

For each timing diagram in FIG. 7A, ff., the vertical axis represents drive current applied to the red-, green-, or blue-emitting illuminator. In examples in which the illuminator is a laser, the modulation is between below-threshold drive current A and above-threshold drive current B, where 'threshold' refers to the laser's drive-current threshold for stimulated radiative emission. In some examples, a nonzero value of below-threshold drive current A provides decreased power loss and emission latency.

Figure 8:
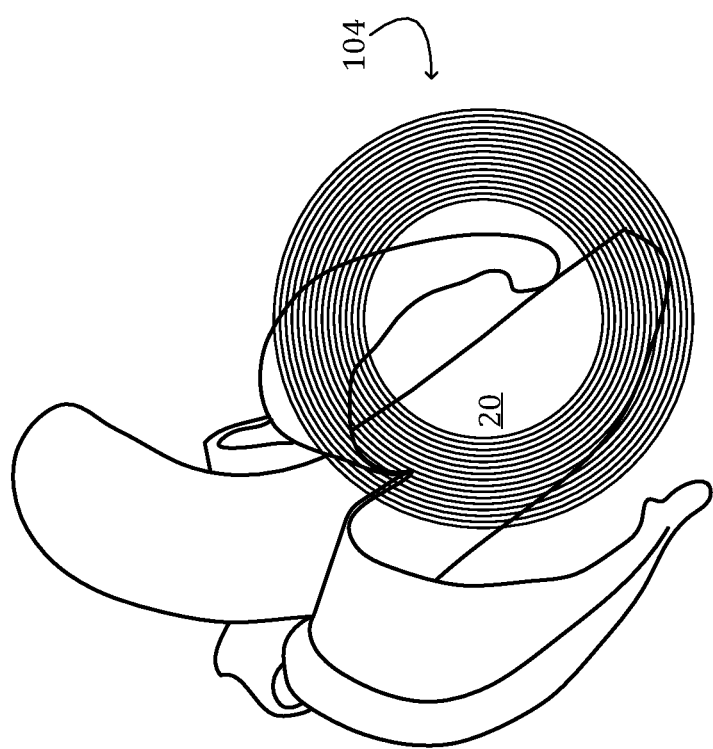
FIG. 8 illustrates an example interference fringe that may be observed on a near-eye display device.

The insets in FIGS. 7A, ff. are plots of emission power as functions of wavelength. The wavelength range for each inset well within and much narrower than the afore-noted wavelength range of the indicated primary color. The inset of FIG. 7A shows an example emission spectrum 102G1 of green-emitting diode laser 26G1, using the indicated modulation scheme. The emission spectrum has a relatively narrow $FWHM_1$, which corresponds to a sparse longitudinal-mode spacing. FIG. 8 provides a rough illustration of a display artifact 104 that may be observed through a near-eye display device in which an SLM is illuminated by laser 26G1. As noted hereinabove, the source of the artifact is coincidence between a longitudinal mode of coherent emission and the path-length difference along plural optical paths that carry the coherent emission from the laser to the user's pupil.

Figure 9:
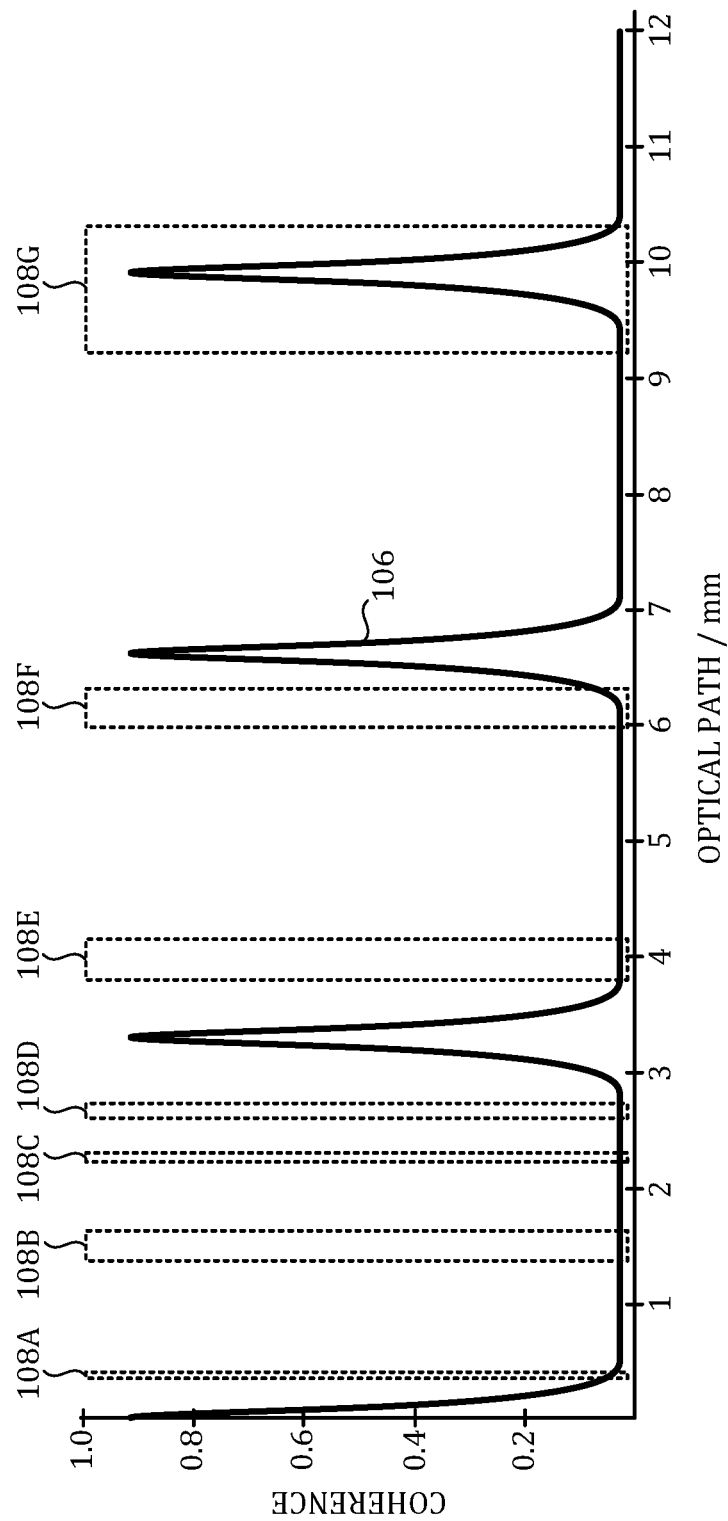
FIG. 9 is a plot of a Fourier transform of example laser emission overlaid with length ranges corresponding to observed optical path-length differences for an example near-eye display device.

FIG. 9 presents data that illustrates this coincidence by way of a non-limiting, example. In particular, FIG. 9 is a plot of a Fourier transform 106 of green laser emission, such as the emission from laser 26G1, overlaid with plural length ranges 108. The length ranges corresponding to selected optical path-length differences observable for an example near-eye display device. As expected, the longitudinal mode spacing is approximately two times the optical cavity length (which is the cavity length multiplied by the index of refraction) of the laser. For instance, a blue laser may have a cavity length in the range of 300 to 900 µm; a green laser may have a cavity length in the range of 400 to 1000 µm; and a red laser may have a cavity length in the range of 600 to 2000 µm.

More particularly, length range 108A corresponds to complex 1a DOE1 1a3 1b1b 01b33 RG plate. Length range 108B corresponds to complex 1a DOE1 1a3 1b1b 01b33 BG plate. Length range 108C corresponds to zero-order in glass RG plate. Length range 108D corresponds to complex 1b DOE101b31a1a1a33 RG plate. Length range 108E corresponds to complex 1bDOE101b31a1a1a33 BG plate. Length range 108F corresponds to DOE3-2order RG plate. Length range 108G corresponds to DOE2 order BG plate. Because Fourier transform 106 has peak coherence within length range 108G, it is expected that this mode will give rise to an interference fringe due to an optical path length passing through the RG plate at second order.

While coherent illumination may cause display artifacts in display systems of various kinds, a near-eye display device with a pupil-expansion optic is particularly prone to such artifacts—as the primary function of the pupil expander is to multiply the number of optical paths from the display projector to the user's pupil. Presented next are various spectral-broadening approaches that may be used in a near-eye display device to wash out the interference fringes caused by the coincidence between longitudinal modes and optical path-length differences.

In some examples, a portion of the overall fringe-reduction strategy may include avoidance of longitudinal modes that yield the strongest interference fringes for a given near-eye display configuration. Thus, in a near-eye display device that admits of a plurality of optical path lengths from a laser and through a pupil-expansion optic, where the cavity length of the laser corresponds to a longitudinal mode spacing, the cavity length may be selected to avoid coincidence between the longitudinal mode spacing and any difference in the plurality of optical path lengths. That approach may be practical only for avoidance of the most prominent and/or predictable interference fringes. Accordingly, in scenarios where coincidence between a longitudinal mode of a first laser and an optical path-length difference gives rise to an interference fringe, the cavity length of a second laser of the same primary color may be selected to wash out the interference fringe. The term 'wash out' is meant to convey the idea that every combination of optical paths carrying a longitudinal mode that coincides with the path-length difference also carries numerous other longitudinal modes that fail to coincide with the path-length difference. Each of the other modes combines to weaken the brightness contrast of the interference fringe, reducing it to a chromatic variation that the user cannot perceive.

Thus, one approach herein is to provide spectral diversity by including, within each primary-color band, emission from plural lasers with offset emission-wavelength bands. Returning briefly to FIG. 5, laser enclosure 52A includes two lasers of each primary color: red-emitting lasers 26R1 and 26R2, green-emitting lasers 26G1 and 26G2, and blue-emitting lasers 26B1 and 26B2. The inset of FIG. 7B represents a first wavelength band 102G1 for green-emitting laser 26G1 and a second wavelength band 102G2 for green-emitting laser 26G2. The second wavelength band is spectrally distinct from the first wavelength band but of the same primary color (green) as the first wavelength band. The plot also shows, in dashed lines, the combined emission profile from both of the green-emitting lasers at equal power. The combined emission profile has a $FWHM_{1+2}$, which is greater than the FWHM of wavelength band 102G1 and greater than the FWHM of 102G2.

Figure 10A:
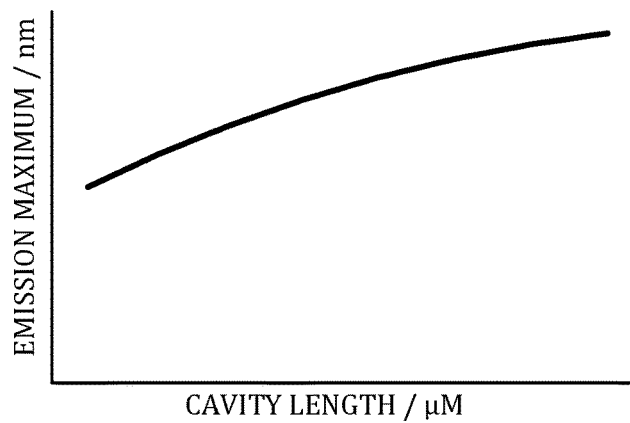
FIGS. 10A, 10B, 10C, and 10D are illustrative plots of selected emission properties of an example laser as functions of controllable parameters.

In some examples the peak wavelength of the first wavelength band may exceed the peak wavelength of the second wavelength band by three nanometers or more. More generally, the first and second wavelength bands (and so on) may be selected to provide spectral diversity for fringe mitigation, while still providing desired irradiance in the same primary-color channel. As illustrated in FIG. 10A, the peak emission wavelength of a diode laser may increase with increasing cavity length. Accordingly, desired wavelength diversity may result from the combined emission of a first laser 26G1 and a second laser 26G2, which differ substantially in cavity length. In other words, the cavity lengths may differ in accordance with an engineering specification, not merely as a result of manufacturing tolerance. In some examples, the cavity length of the first laser may exceed the cavity length of the second laser by five percent or more.

The examples above should not be construed to limit the range of variants and alternatives for achieving the desired spectral broadening. The principles illustrated in the drawings for green laser emission apply equally to laser emission of any primary or non-primary color. While FIG. 5 shows two lasers of each primary color, a given primary-color channel may include more than two lasers, or only one. In any configuration, if spectral diversity sufficient to wash out the red interference fringes cannot be provided by two red-emitting lasers, then a third red-emitting laser may be added. If the interference fringes from one, suitably configured blue-emitting laser are acceptably subtle, then a second blue-emitting laser may be unnecessary. The foregoing configurations enable concurrent operation of selected combinations of lasers. That approach may provide maximum display brightness and a simplified control strategy. Nevertheless, another acceptable approach is to operate the indicated combination of lasers in a time-multiplexed manner and to rely on the latency of the human ocular system to fuse successive fringe-prone image subframes into a fringe-averaged result. This variant is shown in the timing diagram of FIG. 7C.

Figure 10B:
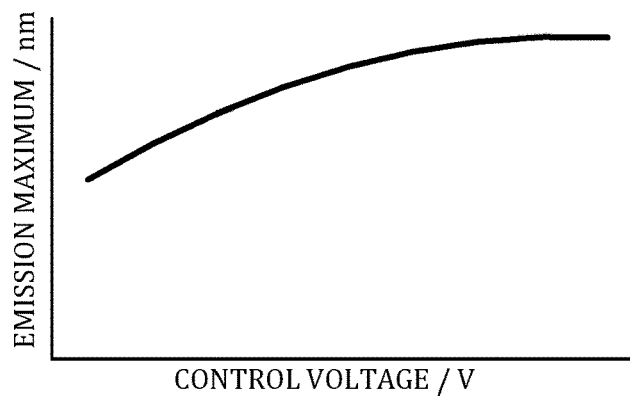

As noted hereinabove, any, some, or all of the lasers 26 may include a reflector structure 32 comprising an electrooptical material. By varying the control voltage applied to the reflector structure, the gain spectrum of the laser may be shifted such that the emission-wavelength band of the laser is controllable based on the control voltage. FIG. 10B provides illustrative plot showing an example dependence of peak emission wavelength on control voltage. In examples supporting this variant, drive circuit 48 may be further configured to vary the control voltage based on control signal from the computer, in order to urge the emission-wavelength band toward a predetermined wavelength distribution. This feature can be used to simulate a variable cavity length. Controlled variation of the gain spectrum may be used, for example, to quell fringes that appear under particular operating conditions of a near-eye display device, such as when the user's gaze is directed to angles at the extrema of the field-of-view.

Another way of achieving spectral diversity is to leverage the effect of drive-current transients on the gain spectrum of a semiconductor laser. This tactic may require fewer lasers to achieve a similar effect as the multi-laser configurations above. For some lasers, a drive-current excursion above the lasing threshold triggers stimulated emission over a relatively broad range of wavelengths (and longitudinal modes). With continued above-threshold bias, the emission relaxes to a narrower distribution at the long-wavelength end of the range. By modulating the drive current above and below the lasing threshold over narrow enough intervals, the relaxation stops abruptly. Thus, under steady-state periodic modulation with sufficient high-frequency content, the steady-state emission from the laser is broadened (FIG. 10C) and blue-shifted (FIG. 10D) relative to the emission under direct-current (d.c.) bias.

Figure 10C:
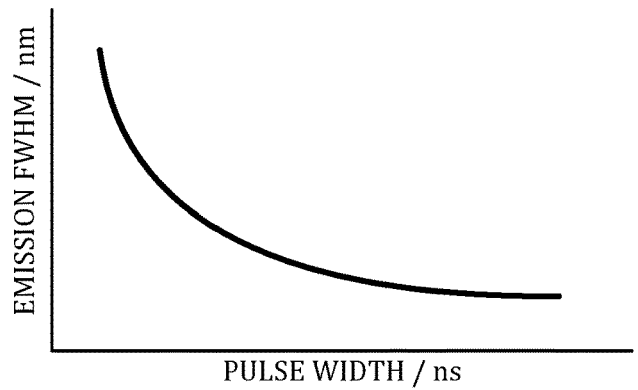
Figure 10D:
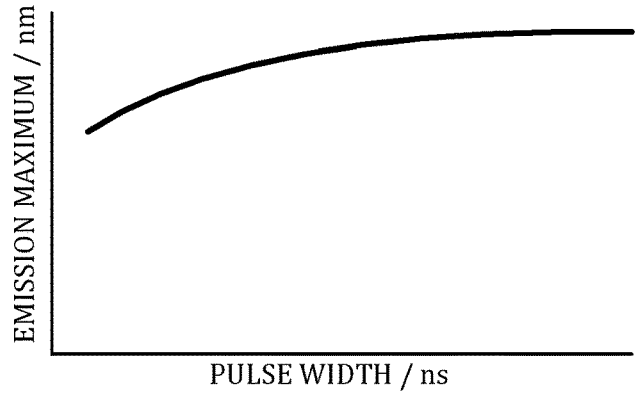

In view of this effect, drive circuit 48 may be configured to drive a periodic current through the gain structure of any laser 26. Computer 12 may be configured to control the periodic current to drive plural cycles of modulation through the gain structure during projection of a single optical image (e.g., a primary-color component of a digital image). As a result the wavelength band of the emission from the laser may be broader than the wavelength band of emission from the same laser when driven by unmodulated drive current. In some examples the periodic current includes a pulse-modulated current including a train of current pulses. As noted above, the value of the pulse width may influence the gain profile of the laser over a domain of sufficiently short pulse widths. The plot in FIG. 10C provides an illustration of this effect. In more particular examples, the pulse-modulated current may include a train of current pulses having a pulse width of twenty nanoseconds or shorter.

The timing diagram of FIG. 11A shows an example pulse train for laser 26G1. The inset of FIG. 11A shows an emission-wavelength band broadened with respect to the emission-wavelength band of the same laser, shown in FIG. 7B. FIG. 11B shows train of shorter pulses for the same laser, and the inset illustrates the emission-wavelength band further broadened.

As noted hereinabove in the context of cavity-length variation, a portion of the fringe-reduction strategy may include judicious avoidance of emission-wavelength bands that yield the strongest fringes for a given near-eye display configuration. Thus, in a near-eye display device that admits of a plurality of optical path lengths from a laser through a pupil-expansion optic, and wherein the gain profile of the laser corresponds to a longitudinal mode spacing, the pulse width may be selected to avoid coincidence between the longitudinal mode spacing and the plurality of optical path lengths. This can be done, for instance, by engineering a predetermined blueshift in the emission-wavelength band of the laser. In scenarios in which coincidence between the longitudinal mode spacing and the plurality of optical path lengths gives rise to an interference fringe, the pulse width may be increased so as to wash out the interference fringe. In configurations including first and second lasers of the same primary color, the pulse width of periodic modulation of the second laser may be used to wash out an interference fringe caused by emission from the first laser, or vice versa.

Generally speaking, the train of current pulses applied to the gain section of a laser defines the average duty cycle of the laser. Computer 12 may be configured to adjust the pulse separation in view of a (predetermined) pulse width, so as to control the average duty cycle. This approach can be appreciated by comparison of FIGS. 11B and 11C, where the emission-wavelength band in FIG. 11C has the same FWHM as that of FIG. 11B but provides only half the power. The computer may control the average duty cycle so as to provide setpoint power in a primary color band, for example. The spectral broadening achievable via pulse-modulation of the drive current is also achievable via continuous-wave (e.g., sinusoidal) modulation with equivalent Fourier spectrum. In some examples, accordingly, the periodic current applied to the gain section may include a radio-frequency modulated current.

Figure 12:
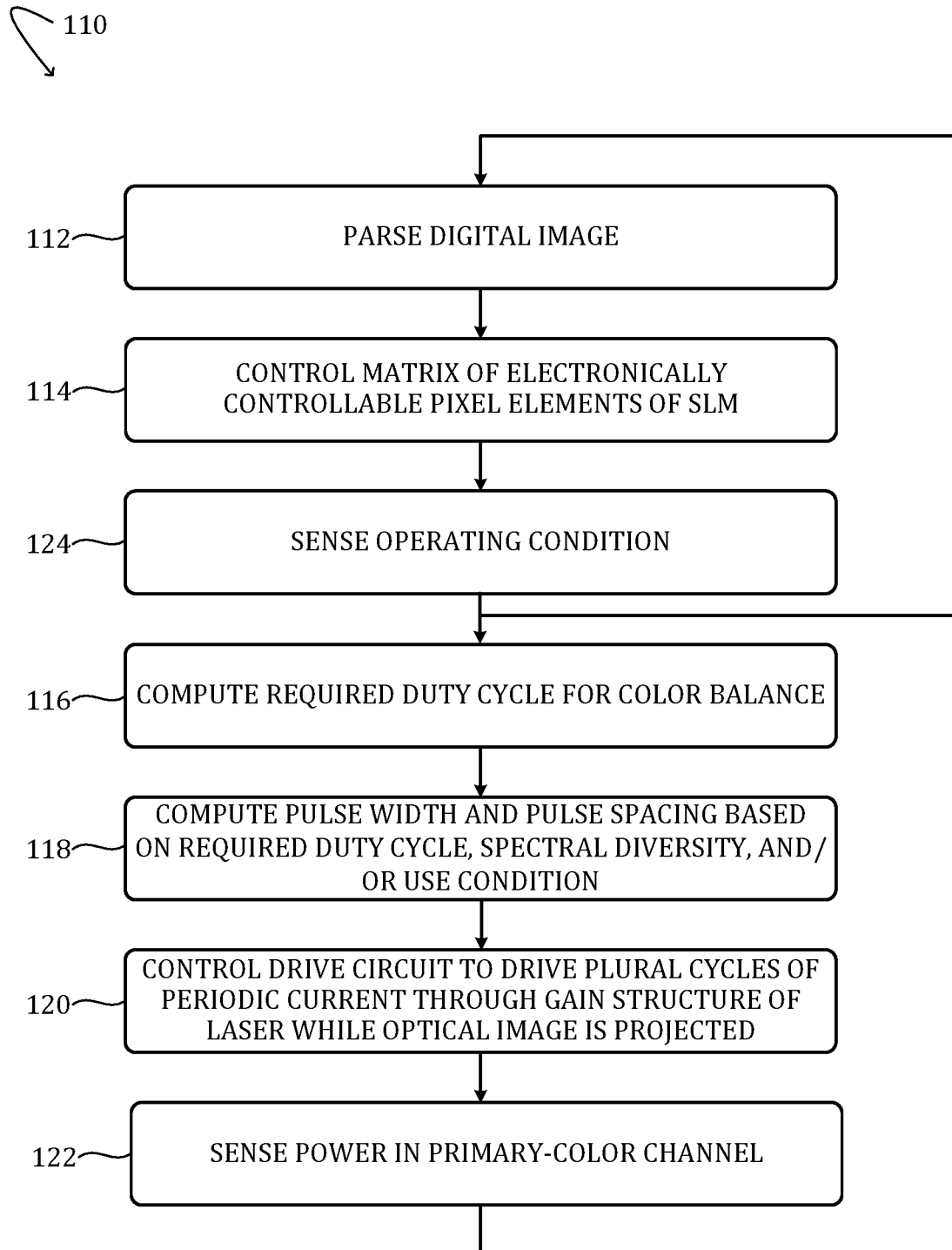
FIG. 12 shows aspects of an example near-eye display method.

FIG. 12 shows aspects of an example near-eye display method 110 to be enacted by an onboard computer of a near-eye display device. The method is supported by the configurations herein and by other near-eye display configurations.

At 112 of method 110, the computer parses a digital image. In some examples, the digital image may correspond to a video frame. In some examples, the digital image may be a component image representing display-image content in one of a plurality of color channels. In parsing the digital image, the computer reads a brightness value corresponding to coordinates $X_i$, $Y_i$ of each pixel i of the digital image.

At 114 the computer controls a matrix of electronically controllable pixel elements of an SLM of the near-eye display device. As noted hereinabove, the SLM is configured to receive emission from one or more lasers and to direct the emission in spatially modulated form to a pupil-expansion optic. The matrix is controlled such that the spatially modulated form of the emission projects an optical image corresponding to the digital image parsed at 112. More specifically, the computer geometrically maps each pixel of the parsed digital image to a row and column of the SLM and controls the bias applied to the pixel element at the mapped row-column intersection. The bias is controlled so as to provide the appropriate relative brightness for each locus of the optical image emerging from the SLM.

At 116 the computer computes the average duty cycle for the pulse-modulated drive current supplied to a laser in a display projector of the near-eye display device. The average duty cycle may be computed so as to provide color balance for field-sequential color-display where plural lasers are pulse-modulated. In some examples the computer may control the average duty cycle so as to provide setpoint power in a primary-color band, such as a red, green, or blue band.

At 118 the computer computes a pulse width and a pulse spacing of the pulse-modulated drive current so as to operate the laser at the duty cycle computed at 116. The pulse width and pulse spacing may be computed in dependence on various factors. Such factors include (a) the average duty cycle computed at 116, (b) the required spectral diversity, and/or (c) any of a plurality of use conditions (vide infra) of the near-eye display device. In some examples the pulse width may be fully determined by the required spectral diversity; accordingly the computer may adjust the pulse separation in view of the fully determined pulse width, so as to arrive at the average duty cycle computed at 116.

At 120 the computer controls a drive circuit of the near-eye display device to drive plural cycles of periodic current through a gain structure of a laser while the optical image corresponding to the parsed digital image is projected. For instance, plural cycles of the modulation may be received during a period in which the SLM is set to a given primary-color component. In this example, the periodic current comprises a pulse train having the pulse width and pulse spacing computed at 118. In some examples the periodic current includes a train of current pulses having a pulse width of twenty nanoseconds or shorter and defining the average duty cycle.

At 122 the computer senses the total power provided within the primary-color channel corresponding to the parsed digital image. The power may be sensed via a photodiode sensor arranged in a beam combiner of the near-eye display device, for example. The power sensed in this manner may be used by the computer to iteratively refine the duty-cycle computation of 116, for example.

As noted above, the computer may be configured to control the average duty cycle, pulse width, and/or pulse separation responsive to one or more operating conditions of the near-eye display device. Generally speaking, the pulse width may be reduced under conditions where increased spectral diversity in a given color channel is required to reduce fringing and, to conserve power, increased under conditions where increased spectral diversity is not required. In near-eye display devices equipped with an eye-tracking sensor, the discriminant for whether increased spectral diversity is required may be linked to the angle of the user's gaze within the field-of-view. In other words, angles at which problematic interference fringes do and do not appear may be predicted based on the physical configuration of the near-eye display components. The computer may be configured to apply more aggressive fringe mitigation when the user's gaze is directed at angles where interference fringes are most prevalent for a given primary color. Such gaze angles may correspond to a condition in which the laser(s) of that primary color are driven by pulse trains of the shortest pulse widths. In some examples, the pulse width may be shortest when the battery is fully charged and may increase as the battery charge is depleted. In some examples, the pulse width may be shortest under low ambient lighting, when the user is most likely to discern interference fringes, and may increase with increasing ambient brightness. The average duty cycle also may depend on the ambient light level—viz., to project brighter display imagery under brighter ambient lighting.

In view of the various ways in which the parameters of the periodic drive current may be controlled pursuant to changes in operating conditions, method 110 includes, at 124, a step in which the various operating conditions are sensed. Such operating conditions may include battery charge, ambient light level, and the angle of the user's gaze within the field-of-view, as examples.

The following section provides additional non-limiting description of a pupil-expansion optic 90A with reference to FIGS. 13A through 13D. In these drawings, optical waveguide 94 comprises a transparent (e.g., glass or polymer) slab with a planar entry face 126 and an opposing, planar exit face 128. FIG. 13A is a plan view of entry face 126; FIG. 13B is a view of exit face 128 as seen through the entry face. FIGS. 13C and 13D are perspective views of the pupil-expansion optic rotated in opposite directions about a horizontal axis aligned to the forward edge.

Pupil-expansion optic 90 includes an entry zone 130 where the optical image is received through entry face 126 and an exit zone 132 where the expanded form of the optical image is released through exit face 128. The pupil-expansion optic also includes an initial-expansion zone 134 that receives the display light from entry zone 130 and expands the display light en route to the exit zone. Pupil-expansion optic 90 includes a plurality of differently configured diffraction gratings arranged in the different zones.

In the illustrated example, rightward expansion grating 96R is arranged on entry face 126, and leftward expansion grating 96L is arranged on exit face 128. The rightward and leftward expansion gratings are entry gratings that extend through initial-expansion zone 134 and overlap in entry zone 130. Exit grating 98 is arranged on entry face 126, in exit zone 132. In other examples, any, some, or all of the diffraction gratings enumerated above may be arranged on the opposite face of the optical waveguide relative to the illustrated configuration.

Operationally, low-angle display light is received in entry zone 130, through entry face 126. Rightward expansion grating 96R and leftward expansion grating 96L cooperate to couple the low-angle display light into optical waveguide 94. Specifically, leftward expansion grating 96L diffracts some of the incoming, low-angle display light obliquely rightward and downward at a supercritical angle, such that it now propagates through the optical waveguide in a rightward and downward direction. At each bounce from entry face 126, the propagating light encounters rightward expansion grating 96R, which directs successive, increasing portions of the light directly downward. This function expands the display light in the rightward direction and conveys the rightward-expanded display light into exit zone 132. In a complementary manner, rightward expansion grating 96R diffracts some of the incoming, low-angle display light obliquely leftward and downward at a supercritical angle, such that it propagates through the optical waveguide in a leftward and downward direction. At each bounce from exit face 128, the propagating light encounters the leftward expansion grating, which directs successive, increasing portions of the light directly downward. This function expands the display light in the leftward direction and conveys the leftward-expanded display light into exit zone 132. In the exit zone, the propagating display light at each bounce from entry face 126 encounters exit grating 98, which directs successive, increasing portions of the rightward- and leftward-expanded display light out of optical waveguide 94. In this manner, the display light is expanded in the downward direction—i.e., perpendicular to the rightward and leftward expansion effected by the right- and leftward expansion gratings.

The following section provides additional non-limiting description of monocular system 18 and near-eye display device 10. Each optical image formed by monocular system 18 is a virtual image presented at a predetermined distance $Z_O$ in front of user O. The distance $Z_O$ is referred to as the 'depth of the focal plane' of the optical image. In some monocular systems, the value of $Z_O$ is a fixed function of the design parameters of display projector 22, entry grating 96, exit grating 98, and/or other fixed-function optics. Based on the permanent configuration of these structures, the focal plane may be positioned at a desired depth. In one example, $Z_O$ may be set to 'infinity', so that each optical system presents a optical image in the form of collimated light rays. In another example, $Z_O$ may be set to 200 centimeters, requiring the optical system to present each optical image in the form of diverging light. In some examples, $Z_O$ may be chosen at design time and remain unchanged for all virtual imagery presented by the display system. Alternatively, the optical systems may be configured with electronically adjustable optical power, to allow $Z_0$ to vary dynamically according to the range of distances over which the virtual imagery is to be presented.

A binocular near-eye display device employing a fixed or variable focal plane may be capable of presenting virtual-display imagery perceived to lie at a controlled, variable distance in front of, or behind, the focal plane. This effect can be achieved by controlling the horizontal disparity of each pair of corresponding pixels of the right and left stereo images, as described below with reference to FIGS. 14A and 14B.

Figure 14B:
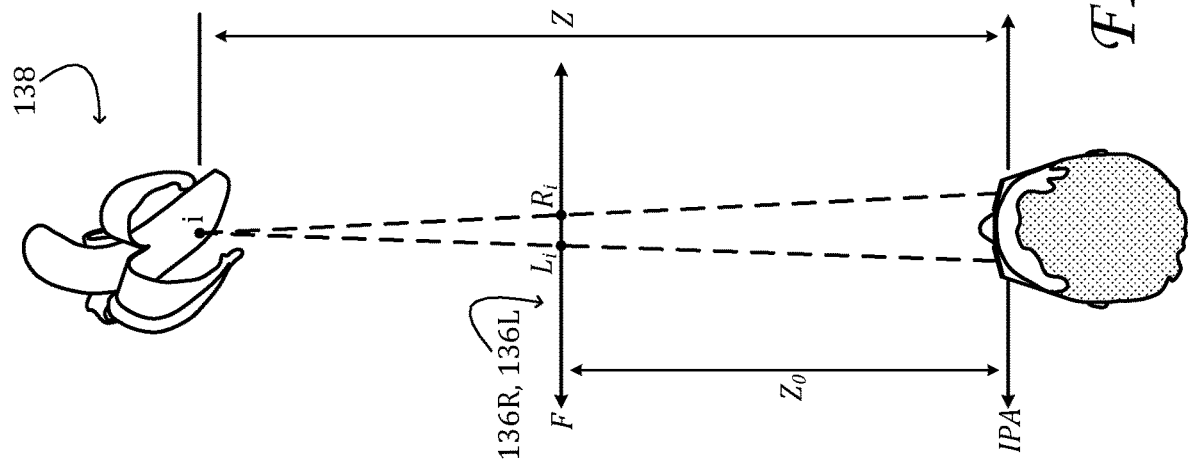
FIGS. 14A and 14B show aspects of stereoscopic display projection in an example near-eye display device.
Figure 14A:
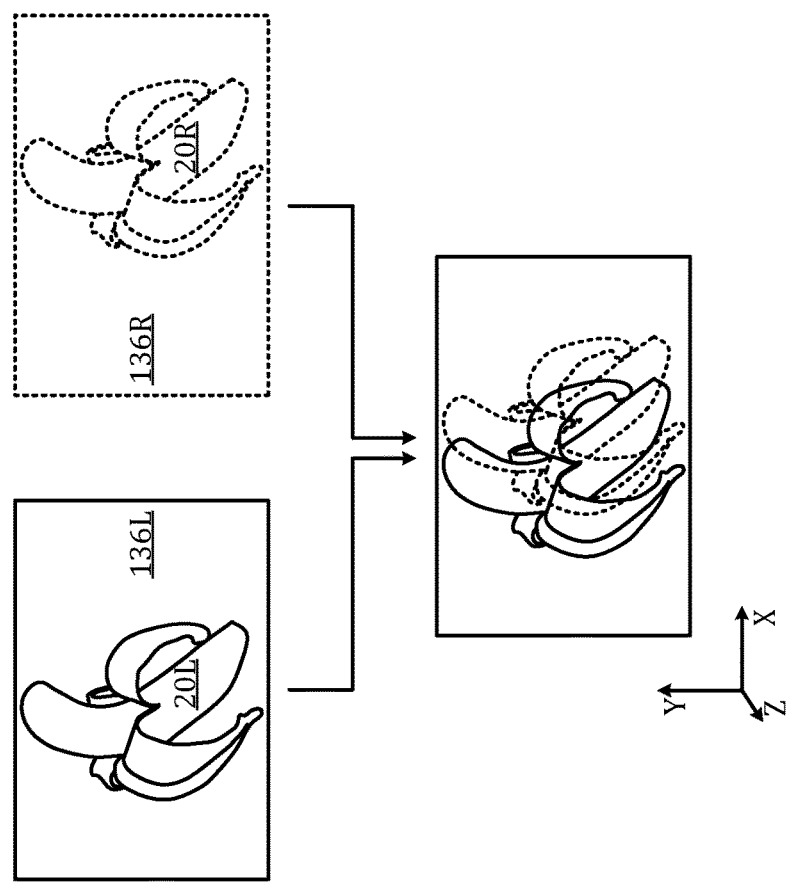

FIG. 14A shows right and left image frames 136R and 136L overlaid upon each other for ease of illustration. The right image frame encloses right optical image 20R, and the left image frame encloses left optical image 20L. Viewed concurrently through a near-eye display device 10, the right and left optical images may appear to the user as 3D hologram 138, comprised of individually rendered loci. Each locus i of the visible surface of the hologram has a depth coordinate $Z_i$ associated with a corresponding pixel $(X_i, Y_i)$ of each of the right and left optical images. The desired depth coordinate may be simulated as follows.

At the outset, a distance $Z_0$ to a focal plane F of the near-eye display system is chosen. Then the depth coordinate Z for every locus i of the visible surface of the hologram is set. This is done by adjusting the positional disparity of the two pixels corresponding to locus i in the right and left optical images relative to their respective image frames. In FIG. 14B, the pixel corresponding to locus i in the right image frame is denoted $R_i$, and the corresponding pixel of the left image frame is denoted $L_i$. In FIG. 14B, the positional disparity is positive—i.e., $R_i$ is to the right of $L_i$ in the overlaid image frames. Positive positional disparity causes locus i to appear behind focal plane F. If the positional disparity were negative, the locus would appear in front of the focal plane. Finally, if the right and left optical images were superposed (no disparity, $R_i$ and $L_i$ coincident) then the locus would appear to lie directly on the focal plane. Without tying this disclosure to any particular theory, the positional disparity D may be related to Z, $Z_0$, and to the interpupillary distance (IPD) of the user by $$D = IPD \times \left(1 - \frac{Z_0}{Z}\right).$$

In some examples, computer 12 maintains a model of the Cartesian space in front of the user, in a frame of reference fixed to near-eye display device 10. The user's pupil positions are mapped onto this space, as are the image frames 136R and 136L, each positioned at the predetermined depth $Z_0$. Then, the visible surface of hologram 138 is assembled, with each locus i of the viewable surface of the imagery having coordinates $X_i$, $Y_i$, and $Z_i$, in the common frame of reference. For each locus of the visible surface, two-line segments are constructed—a first line segment to the pupil position of the user's right eye and a second line segment to the pupil position of the user's left eye. The pixel $R_i$ of the right optical image, which corresponds to locus i, is taken to be the intersection of the first line segment in right image frame 136R. Likewise, the pixel $L_i$ of the left optical image is taken to be the intersection of the second line segment in left image frame 136L. This procedure automatically provides the appropriate amount of shifting and scaling to correctly render the visible surface, placing every locus i at the appropriate distance and with the appropriate perspective. In some examples, the approach outlined above may be facilitated by real-time estimation of the user's pupil positions. That variant is described hereinafter, with reference to FIG. 15. In examples in which pupil estimation is not attempted, a suitable surrogate for the pupil position, such as the center of rotation of the pupil position, or eyeball position, may be used instead.

Returning again to FIG. 2, monocular system 18 may be configured to vary the focal plane on which virtual display imagery is presented. In the illustrated example, the monocular system includes a variable-focus lens 140 of variable optical power. Computer 12 is configured to control the focusing bias of the variable-focus lens such that the display light is imaged onto a focal plane positioned at a controlled, variable distance from pupil position 92. In stereoscopic near-eye display devices, this control feature may be enacted in combination with appropriate control of the stereo disparity as described above. Monocular system 18 of FIG. 2 also includes a fixed-focus lens 142 in series with variable-focus lens 140 and arranged to pre-bias the vergence of the display light released from pupil-expansion optic 90.

Applied in an AR display system, variable-focus lens 140 and/or fixed-focus lens 142 would alter the vergence of the external light received from opposite the user. In FIG. 2, accordingly, monocular system 18 further comprises a variable-compensation lens 144 of variable optical power and a fixed compensation lens 146. In some examples, the fixed optical power of fixed-compensation lens 146 may oppose and substantially reverse the fixed optical power of fixed-focus lens 142. When controlling the focusing bias such that the display light is imaged onto a focal plane positioned at a controlled, variable distance from user O, computer 12 may also synchronously control the compensation bias of the variable compensation lens such that the external light reaches the user with unchanged vergence.

Figure 15:
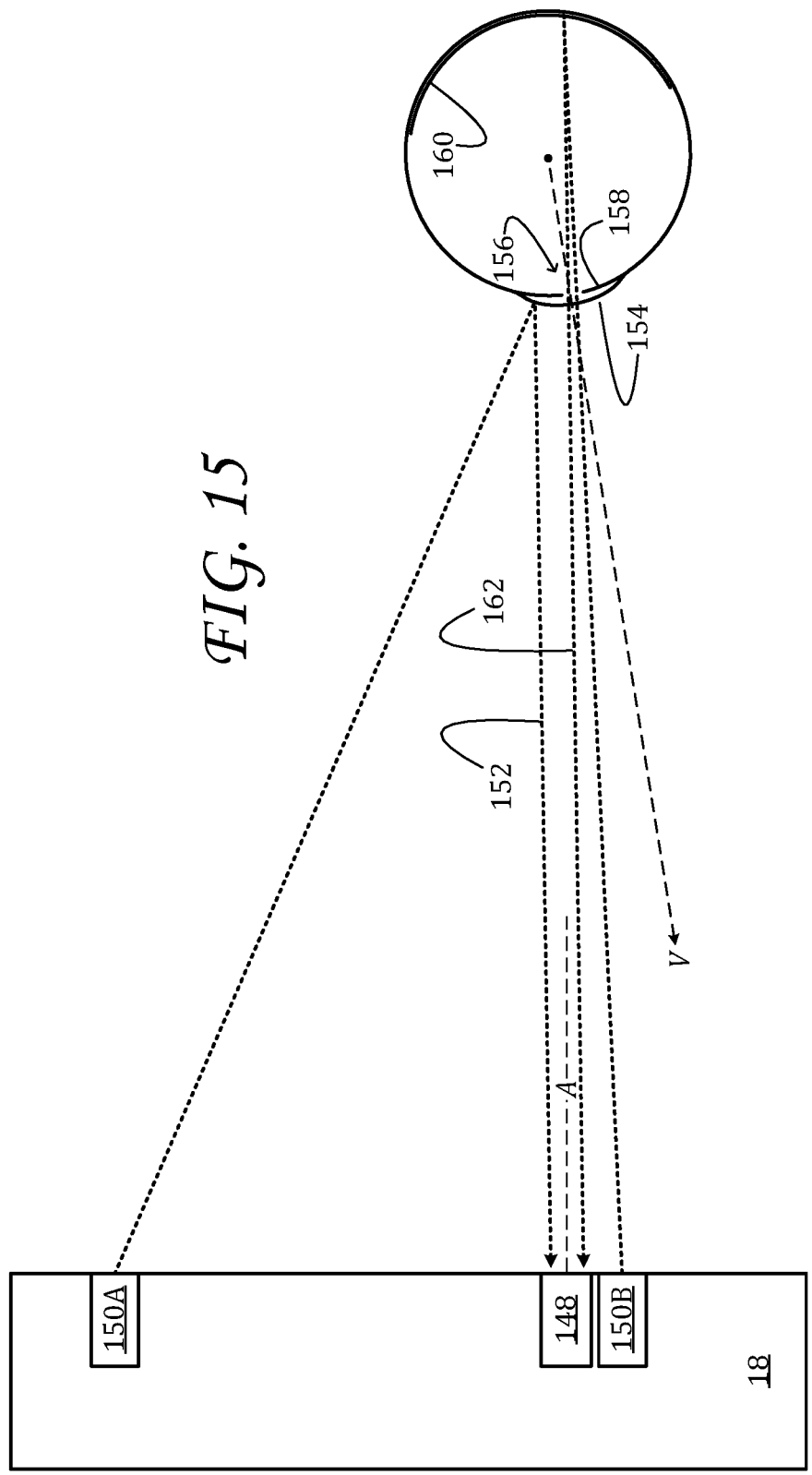
FIG. 15 shows aspects related to ocular sensing in an example near-eye display device.

FIG. 15 is provided in order to illustrate schematically how ocular sensing may be enacted in near-eye display device 10. This approach may be used to sense the user's pupil positions for highly accurate 3D rendering, to accommodate a range of different users, and/or to support the methods herein.

The configuration illustrated in FIG. 9 includes, for each monocular system 18, a camera 148, an on-axis lamp 150A and an off-axis lamp 150B. Each lamp may comprise a light-emitting diode (LED) or diode laser, for example, which emits infrared (IR) or near-infrared (NIR) illumination in a high-sensitivity wavelength band of the camera.

The terms 'on-axis' and 'off-axis' refer to the direction of illumination of the eye with respect to the optical axis A of camera 148. As shown in FIG. 15, off-axis illumination may create a specular glint 152 that reflects from the user's cornea 154. Off-axis illumination may also be used to illuminate the eye for a 'dark pupil' effect, where pupil 156 appears darker than the surrounding iris 158. By contrast, on-axis illumination from an IR or NIR source may be used to create a 'bright pupil' effect, where the pupil appears brighter than the surrounding iris. More specifically, IR or NIR illumination from on-axis lamp 150A may illuminate the retroreflective tissue of the retina 160, which reflects the illumination back through the pupil, forming a bright image 162 of the pupil. Image data from the camera is conveyed to associated logic of computer 12. There, the image data may be processed to resolve such features as one or more glints from the cornea, or the pupil outline. The locations of such features in the image data may be used as input parameters in a model—e.g., a polynomial model—that relates feature position to the apparent center of the pupil.

The configuration illustrated in FIG. 15 may also be used to sense relatively long-timescale pupillary movement associated with changing gaze vector or accommodation (when enacted concurrently in the right and left monocular systems) as well as relatively short-timescale saccadic movement. The configuration illustrated in FIG. 15 may also be used to sense nictitation, In other configurations, the pupil position may be determined, estimated, or predicted in various other ways—e.g., using an electrooculographic sensor in lieu of ocular imaging.

The methods herein may be tied to a computer system of one or more computing devices. Such methods and processes may be implemented as an application program or service, an application programming interface (API), a library, and/or other computer-program product.

Figure 16:
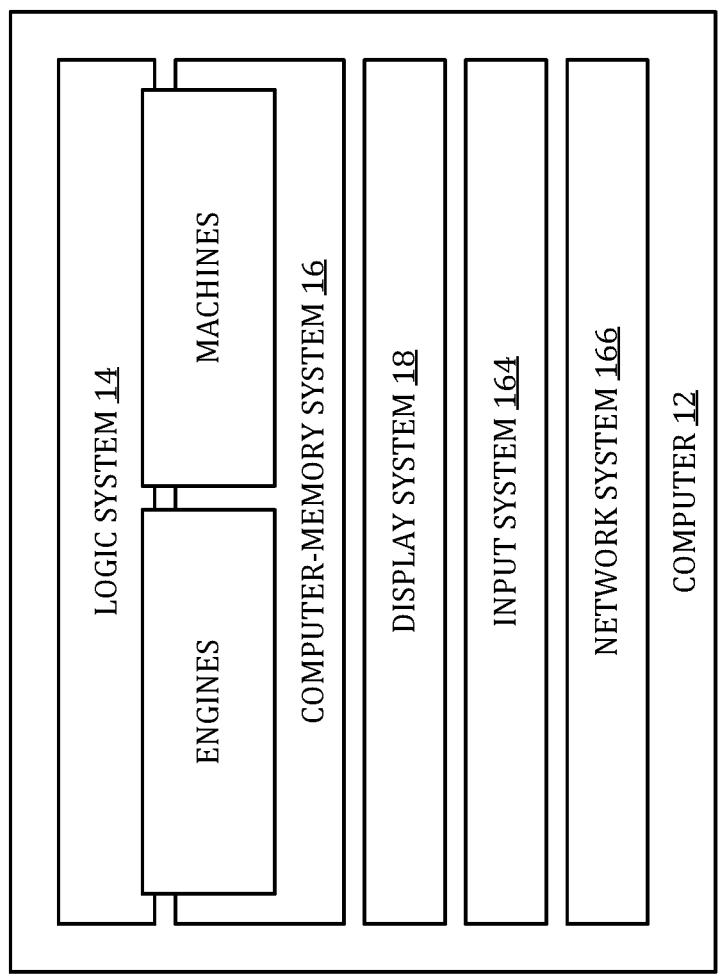
FIG. 16 shows aspects of an example onboard computer of a near-eye display device.

FIG. 16 provides a schematic representation of a computer 12 configured to provide some or all of the computer-system functionality disclosed herein. Computer 12 may take the form of onboard computer 12A, while in some examples at least some of the computer-system functionality may be provided by communicatively coupled offboard computer.

Computer 12 includes a logic system 14 and a computer-memory system 16. Computer 12 may optionally include a display system 18, an input system 164, a network system 166, and/or other systems not shown in the drawings.

Logic system 14 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 16 includes at least one physical device configured to temporarily and/or permanently hold computer system information, such as data and instructions executable by logic system 14. When the computer-memory system includes two or more devices, the devices may be collocated or remotely located. Computer-memory system 16 may include at least one volatile, nonvolatile, dynamic, static, read/write, read-only, random-access, sequential-access, location-addressable, file-addressable, and/or content-addressable computer-memory device. Computer-memory system 16 may include at least one removable and/or built-in computer-memory device. When the logic system executes instructions, the state of computer-memory system 16 may be transformed—e.g., to hold different data.

Aspects of logic system 14 and computer-memory system 16 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 14 and computer-memory system 16 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 18 may be used to present a visual representation of data held by computer-memory system 16. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 164 may comprise or interface with one or more input devices. An input device may include a sensor device or a user input device. Examples of user input devices include a keyboard, mouse, or touch screen.

When included, network system 166 may be configured to communicatively couple computer 12 with one or more other computer. The network system may include wired and/or wireless communication devices compatible with one or more different communication protocols. The network system may be configured for communication via personal-, local- and/or wide-area networks.

One aspect of this disclosure is directed to a near-eye display device comprising a pupil-expansion optic, a laser having a gain structure, a drive circuit coupled operatively to the laser, a spatial light modulator (SLM), and a computer.

The SLM has a matrix of electronically controllable pixel elements and is configured to receive emission from the laser and direct the emission in spatially modulated form to the pupil-expansion optic. Coupled operatively to the drive circuit and the SLM, the computer is configured to: parse a digital image, trigger the emission from the laser by causing the drive circuit to drive a periodic current through the gain structure, and control the matrix of pixel elements such that the spatially modulated form of the emission projects an optical image corresponding to the digital image. The periodic current includes plural cycles of modulation driven through the gain structure while the optical image is projected.

In some implementations, the wavelength band of the emission is broader than the wavelength band of emission from the same laser when driven by unmodulated drive current. In some implementations, the periodic current includes a pulse-modulated current. In some implementations, the pulse-modulated current includes a train of current pulses having a pulse width of twenty nanoseconds or shorter. In some implementations, the laser admits of a gain profile, and the pulse width influences the gain profile. In some implementations, the near-eye display device admits of a plurality of optical path lengths from the laser through the pupil-expansion optic, the gain profile corresponds to a longitudinal mode spacing, and the pulse width is selected to avoid coincidence between the longitudinal mode spacing and the plurality of optical path lengths. In some implementations, coincidence between a mode spacing and the plurality of optical path lengths gives rise to an interference fringe, and the pulse width is increased to wash out the interference fringe. In some implementations, laser is configured to emit within a primary-color band, the train of pulses define an average duty cycle, and the computer is further configured to control the average duty cycle to provide setpoint power in the primary-color band. In some implementations, the computer is further configured to control the pulse width responsive to an operating condition of the near-eye display device. In some implementations, the operating condition includes a battery state. In some implementations, the operating condition includes ambient brightness. In some implementations, the gain structure includes an anode and a cathode, and the drive circuit is configured to drive the periodic current from the anode to the cathode. In some implementations, the periodic current includes a radio-frequency modulated current. In some implementations, the pupil-expansion optic includes an optical waveguide supporting one or more diffractive optical elements. In some implementations, the digital image is one of a plurality of component digital images parsed by the computer, each associated with a corresponding primary-color band, and the computer is further configured to: coordinately control the matrix of pixel elements and the drive circuit in a time-multiplexed manner to provide field-sequential color display. In some implementations, the SLM is a reflective SLM.

Another aspect of this disclosure is directed to a near-eye display method enacted in a computer of a near-eye display device. The method comprises: parsing a digital image; triggering emission from a laser by causing a drive circuit to drive a periodic current through a gain structure of the laser; and controlling a matrix of electronically controllable pixel elements of an SLM configured to receive emission from the laser and direct the emission in spatially modulated form to a pupil-expansion optic, the matrix is controlled such that the spatially modulated form of the emission projects an optical image corresponding to the digital image, and the periodic current includes plural cycles of modulation driven through the gain structure while the optical image is projected.

In some implementations, the periodic current includes a train of current pulses having a pulse width of twenty nanoseconds or shorter and defining an average duty cycle. In some implementations, the method further comprises controlling the average duty cycle to provide setpoint power in a primary-color band.

Another aspect of this disclosure is directed to a near-eye display device comprising a pupil-expansion optic, a laser, a drive circuit, an SLM, and a computer. The laser has a gain structure and is configured to emit within a primary-color band. The drive circuit is coupled operatively to the laser and configured to drive a periodic current through the gain structure. The SLM has a matrix of electronically controllable pixel elements and is configured to receive emission from the laser and direct the emission in spatially modulated form to the pupil-expansion optic. Coupled operatively to the drive circuit and the SLM, the computer is configured to: parse a digital image, trigger the emission from the lasers by causing the drive circuit to drive a periodic current through the second gain structure, the periodic current comprising a train of current pulses having a pulse width of twenty nanoseconds or shorter and defining an average duty cycle, control the matrix of pixel elements such that the spatially modulated form of the emission projects an optical image corresponding to the digital image, the periodic current includes plural cycles of modulation driven through the gain structure while the optical image is projected, and control the average duty cycle to provide setpoint power in the primary-color band.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A near-eye display device comprising:
   a pupil-expansion optic;
   a laser having a gain structure and configured for emission in a primary-color band;
   a drive circuit coupled operatively to the laser;
   a spatial light modulator (SLM) having a matrix of electronically controllable pixel elements, the SLM being configured to receive the emission from the laser and direct the emission in spatially modulated form to the pupil-expansion optic; and
   coupled operatively to the drive circuit and the SLM, a computer configured to:
      parse a digital image,
      control the matrix of pixel elements such that the spatially modulated form of the emission projects an optical image corresponding to the digital image,
      cause the drive circuit to drive periodic current including a train of current pulses through the gain structure while the optical image is projected, the current pulses having a predetermined pulse width selected to broaden the emission relative to an unmodulated emission of the laser, and increase or decrease a separation between the current pulses of the predetermined pulse width, so as to control an average duty cycle of the periodic current and thereby provide setpoint power in the primary-color band.

2. The near-eye display device of claim 1 wherein the wavelength band of the emission is broader than the wavelength band of emission from the same laser when driven by unmodulated drive current.

3. The near-eye display device of claim 1 wherein the train of current pulses has a pulse width of twenty nanoseconds or shorter.

4. The near-eye display device of claim 3 wherein the laser admits of a gain profile, and wherein the pulse width influences the gain profile.

5. The near-eye display device of claim 4 wherein the near-eye display device admits of a plurality of optical path lengths from the laser through the pupil-expansion optic, wherein the gain profile corresponds to a longitudinal mode spacing, and wherein the pulse width is selected to avoid coincidence between the longitudinal mode spacing and the plurality of optical path lengths.

6. The near-eye display device of claim 5 wherein coincidence between a mode spacing and the plurality of optical path lengths gives rise to an interference fringe, and wherein the pulse width is increased to wash out the interference fringe.

7. The near-eye display device of claim 3 wherein the computer is further configured to control the pulse width responsive to an operating condition of the near-eye display device.

8. The near-eye display device of claim 7 wherein the operating condition includes a battery state.

9. The near-eye display device of claim 7 wherein the operating condition includes ambient brightness.

10. The near-eye display device of claim 1 wherein the gain structure includes an anode and a cathode, and wherein the drive circuit is configured to drive the periodic current from the anode to the cathode.

11. The near-eye display device of claim 1 wherein the periodic current includes a radio-frequency modulated current.

12. The near-eye display device of claim 1 wherein the pupil-expansion optic includes an optical waveguide supporting one or more diffractive optical elements.

13. The near-eye display device of claim 1 wherein the digital image is one of a plurality of component digital images parsed by the computer, each associated with a corresponding primary-color band, and wherein the computer is further configured to:
coordinately control the matrix of pixel elements and the drive circuit in a time-multiplexed manner to provide field-sequential color display.

14. The near-eye display device of claim 1 wherein the SLM is a reflective SLM.

15. The near-eye display device of claim 1 wherein the laser is one of a plurality of lasers of a field-sequential color display, wherein a pulse-modulated drive current is supplied to each of the plurality of lasers, and wherein the computer is configured to compute the average duty cycle for pulse-modulated drive current supplied to each of the plurality of lasers, so as to provide color balance.

16. Enacted in a computer of a near-eye display device, a near-eye display method comprising:
parsing a digital image;
controlling a matrix of electronically controllable pixel elements of a spatial light modulator (SLM) configured to receive emission from a laser and direct the emission in spatially modulated form to a pupil-expansion optic, wherein the matrix is controlled such that the spatially modulated form of the emission projects an optical image corresponding to the digital image,
causing a drive circuit to drive periodic current including a train of current pulses through a gain structure while the optical image is projected, the current pulses having a predetermined pulse width selected to broaden the emission relative to an unmodulated emission of the laser, and
increasing or decreasing a separation between the current pulses of the predetermined pulse width, so as to control an average duty cycle of the periodic current and thereby provide setpoint power in a primary-color band.

17. The method of claim 16 wherein the train of current pulses has a pulse width of twenty nanoseconds or shorter.

18. The method of claim 16 further comprising sensing a light intensity, wherein the separation between the current pulses is increased or decreased based at least partly on the light intensity as sensed.

19. The method of claim 18 wherein the light intensity corresponds to power in the primary color band.

20. The method of claim 18 wherein the light intensity is an ambient light intensity.

21. A near-eye display device comprising:
a pupil-expansion optic;
a laser having a gain structure and configured for emission in a primary-color band;
a drive circuit coupled operatively to the laser;
a spatial light modulator (SLM) having a matrix of electronically controllable pixel elements, the SLM being configured to receive the emission from the laser and direct the emission in spatially modulated form to the pupil-expansion optic; and
coupled operatively to the drive circuit and the SLM, a computer configured to:
parse a digital image,
control the matrix of pixel elements such that the spatially modulated form of the emission projects an optical image corresponding to the digital image,
cause the drive circuit to drive periodic current including a train of current pulses through the gain structure while the optical image is projected, the current pulses having a predetermined pulse width of twenty nanoseconds or shorter, selected to broaden the emission relative to an unmodulated emission of the laser, and
increase or decrease a separation between the current pulses of the predetermined pulse width, so as to control an average duty cycle of the periodic current and thereby provide setpoint power in the primary-color band,
wherein the laser is one of a plurality of lasers of a field-sequential color display, wherein pulse-modulated drive current is supplied to each of the plurality of lasers, and wherein the computer is configured to control the average duty cycle for the pulse-modulated drive current supplied to each of the plurality of lasers to provide color balance.

* * * * *